US012604477B2

(12) United States Patent
Song et al.

(10) Patent No.: US 12,604,477 B2
(45) Date of Patent: Apr. 14, 2026

(54) SEMICONDUCTOR DEVICE WITH CONDUCTIVE LAYERS IN ISOLATION STRUCTURES

(71) Applicant: Samsung Electronics Co., Ltd., Suwon-si (KR)

(72) Inventors: Younggul Song, Hwaseong-si (KR); Junyeong Seok, Seoul (KR); Eunchu Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 787 days.

(21) Appl. No.: 17/896,546

(22) Filed: Aug. 26, 2022

(65) Prior Publication Data

US 2023/0189528 A1 Jun. 15, 2023

(30) Foreign Application Priority Data

Dec. 10, 2021 (KR) ........................ 10-2021-0176267

(51) Int. Cl.
H01L 27/11573 (2017.01)
H01L 27/1157 (2017.01)
(Continued)

(52) U.S. Cl.
CPC ............. H10B 43/40 (2023.02); H10B 43/27 (2023.02); H10B 43/35 (2023.02)

(58) Field of Classification Search
CPC .................................................... H01L 23/585
See application file for complete search history.

(56) References Cited

U.S. PATENT DOCUMENTS 7,679,133 B2 3/2010 Son et al.
8,004,918 B2 8/2011 Gouin
(Continued)

FOREIGN PATENT DOCUMENTS

CN 108447865 A * 8/2018 ............. H10B 43/40
CN 115312524 A * 11/2022 ....... H01L 21/76805
(Continued)

OTHER PUBLICATIONS

Yixin Luo et al., "HeatWatch: Improving 3D NAND Flash Memory Device Reliability by Exploiting Self-Recovery and Temperature Awareness" 2018 IEEE International Symposium on High Performance Computer Architecture, p. 504-517.
(Continued)

*Primary Examiner* — Peter Bradford
(74) *Attorney, Agent, or Firm* — Fish & Richardson P.C.

(57) ABSTRACT

A semiconductor device may include a plurality of gate electrode layers stacked in a first direction perpendicular to an upper surface of a substrate, a plurality of channel structures penetrating through the plurality of gate electrode layers and extending in the first direction, a plurality of first isolation structures extending in a second direction parallel to the upper surface of the substrate and dividing the plurality of gate electrode layers into a plurality of blocks, and a plurality of second isolation structures extending in the second direction within each of the plurality of blocks. Each of the plurality of first isolation structures may include only a first vertical insulating layer, and at least one of the plurality of second isolation structures may include a second vertical insulating layer and a conductive layer.

20 Claims, 24 Drawing Sheets

(51) Int. Cl.
  *H01L 27/11582* (2017.01)
  *H10B 43/27* (2023.01)
  *H10B 43/35* (2023.01)
  *H10B 43/40* (2023.01)

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,202,572 B2 | 12/2015 | Bronner et al. | |
| 9,378,832 B1 | 6/2016 | Lu et al. | |
| 9,620,233 B1* | 4/2017 | Dong | G11C 11/5642 |
| 10,916,308 B2 | 2/2021 | Lue | |
| 2010/0025811 A1 | 2/2010 | Bronner et al. | |
| 2011/0233648 A1 | 9/2011 | Seol et al. | |
| 2012/0281481 A1 | 11/2012 | Lue et al. | |
| 2012/0327719 A1 | 12/2012 | Lue | |
| 2013/0040408 A1* | 2/2013 | Nam | H10B 61/22 |
| | | | 438/238 |
| 2013/0100743 A1 | 4/2013 | Lue | |
| 2016/0197092 A1* | 7/2016 | Hong | H10B 43/27 |
| | | | 257/314 |
| 2017/0117289 A1* | 4/2017 | Liu | H10B 43/40 |
| 2018/0374862 A1* | 12/2018 | Lee | H10B 43/40 |
| 2019/0348425 A1 | 11/2019 | Baek | |
| 2022/0415416 A1* | 12/2022 | Prakash | G11C 16/10 |

FOREIGN PATENT DOCUMENTS

| | | | |
|---|---|---|---|
| KR | 10-2018-0138380 A | 12/2018 |
| KR | 10-2019-0128811 A | 11/2019 |

OTHER PUBLICATIONS

Office Action in Korean Appln. No. 10-2021-0176267, mailed on Jun. 30, 2025, 8 pages (with English translation).

Notice of Allowance in Korean Appln. No. 10-2021-0176267, mailed on Dec. 26, 2025, 5 pages (with English translation).

* cited by examiner

SEMICONDUCTOR DEVICE WITH CONDUCTIVE LAYERS IN ISOLATION STRUCTURES

CROSS-REFERENCE TO RELATED APPLICATION(S)

This application claims benefit of priority to Korean Patent Application No. 10-2021-0176267, filed on Dec. 10, 2021 in the Korean Intellectual Property Office, the disclosure of which is incorporated herein by reference in its entirety.

BACKGROUND

Example embodiments of the present disclosure relate to a semiconductor device.

A semiconductor device may include a cell region, in which memory cells writing data are disposed, and a peripheral circuit region, in which circuits controlling the cell region are disposed. Memory cells in the cell region may be divided into a plurality of blocks, and an erase operation may be performed by units of blocks. As the number of executions of a program operation and an erase operation increases, properties of memory cells included in the block may deteriorate, and accordingly, performance of a semiconductor device may deteriorate.

SUMMARY

An example embodiment of the present disclosure is to provide a semiconductor device which may, by including a conductive layer in an isolation structure disposed within a block and generating heat by applying a voltage and/or current to the conductive layer, compensate for deterioration of properties of memory cells disposed in a block.

According to an example embodiment of the present disclosure, a semiconductor device may include a plurality of gate electrode layers stacked in a first direction perpendicular to an upper surface of a substrate, a plurality of channel structures penetrating through the plurality of gate electrode layers and extending in the first direction, a plurality of first isolation structures extending in a second direction parallel to the upper surface of the substrate and dividing the plurality of gate electrode layers into a plurality of blocks, and a plurality of second isolation structures extending in the second direction within each of the plurality of blocks. Each of the plurality of first isolation structures may include only a first vertical insulating layer, and at least one of the plurality of second isolation structures may include a second vertical insulating layer and a conductive layer.

According to an example embodiment of the present disclosure, a semiconductor device may include a cell region and a peripheral circuit region. The cell region may include a plurality of gate electrode layers stacked in a first direction perpendicular to an upper surface of a substrate and a plurality of first isolation structures extending in a second direction parallel to the upper surface of the substrate and dividing the plurality of gate electrode layers into a plurality of blocks. The peripheral circuit region may include a row decoder connected to the plurality of gate electrode layers. Each of the plurality of blocks may include at least one second isolation structure extending in the second direction and having a conductive layer connected to the row decoder. The row decoder may be configured generate heat in the conductive layer by applying a current to the at least one second isolation structure included in a selected block among the plurality of blocks.

According to an example embodiment of the present disclosure, a semiconductor device may include a substrate; a plurality of gate electrode layers stacked in a first direction perpendicular to an upper surface of the substrate; a plurality of channel structures extending in the first direction penetrating through the plurality of gate electrode layers; and a plurality of isolation structures extending in a second direction parallel to the upper surface of the substrate. Each of the plurality of channel structures may include a channel layer connected to the substrate. The plurality of isolation structures may be arranged in a third direction intersecting the second direction. A pair of isolation structures most adjacent to each other in the third direction, among the plurality of isolation structures, may include a first isolation structure and a second isolation structure. The first isolation structure may include only an insulating layer. The second isolation structure may include both an insulating layer and a conductive layer.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
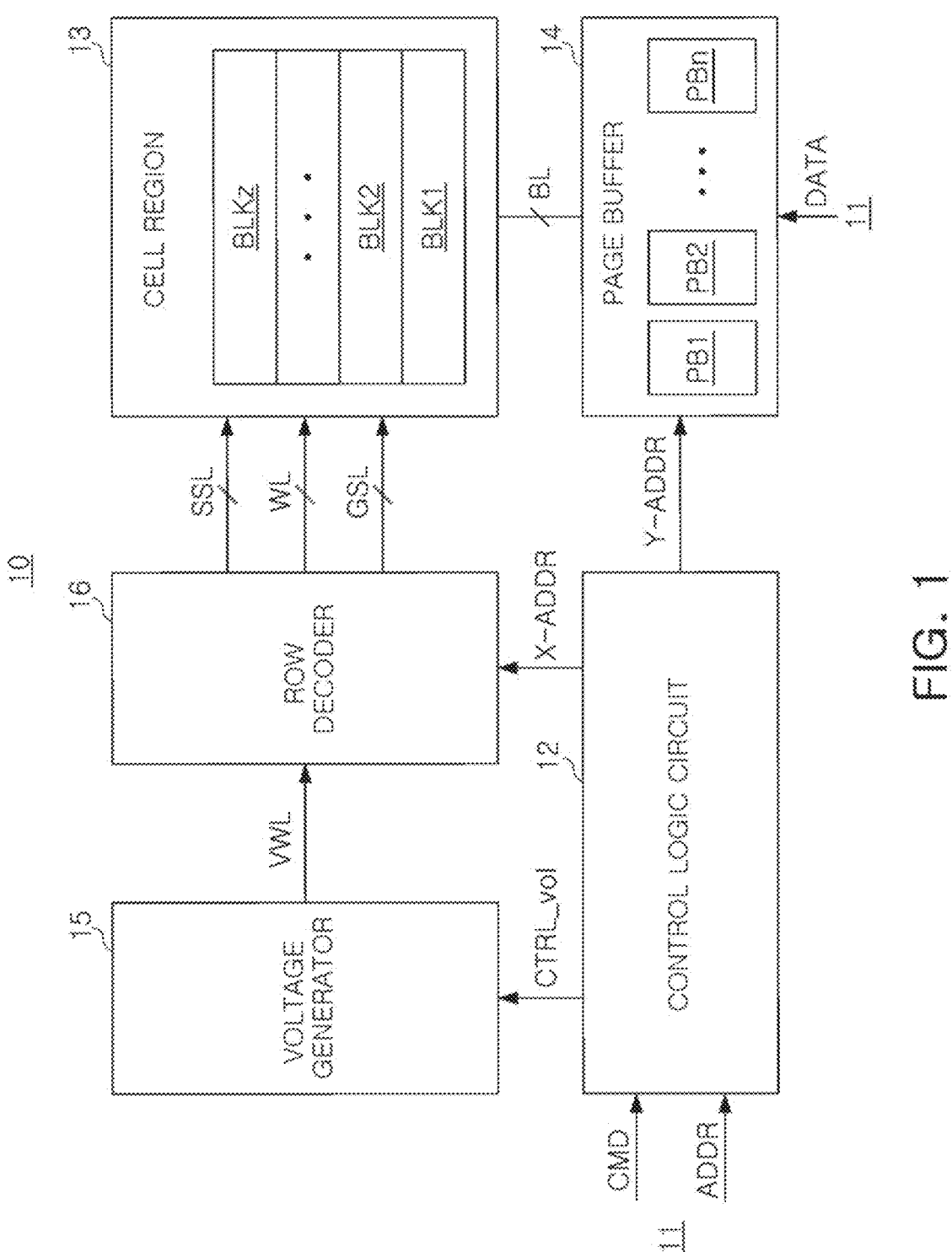
FIG. 1 is a block diagram illustrating a semiconductor device according to an example embodiment of the present disclosure.

FIG. 1 is a block diagram illustrating a semiconductor device according to an example embodiment.

Referring to FIG. 1, a semiconductor device 10 may include a control logic circuit 12, a cell region 13, a page buffer portion 14, a voltage generator 15, and a row decoder 16. The semiconductor device 10 may further include an interface circuit 11, and may further include a column logic, a pre-decoder, a temperature sensor, a command decoder, an address decoder, a source driver, and the like. The semiconductor device 10 may be implemented as a memory device storing data, and may be implemented as, for example, a nonvolatile memory device which may retain stored data even when power is cut off.

The control logic circuit 12 may control various operations in the semiconductor device 10. The control logic circuit 12 may output various control signals in response to a command CMD and/or an address ADDR from the interface circuit 11. For example, the control logic circuit 12 may output a voltage control signal CTRL_vol, a row address X-ADDR, and a column address Y-ADDR.

The cell region 13 may include a plurality of memory blocks BLK1-BLKz (z is a positive integer), and each of the plurality of memory blocks BLK1-BLKz may include a plurality of memory cells. In an example embodiment, the plurality of memory blocks BLK1-BLKz may be isolated from each other by first isolation structures including an insulating material, and second isolation structures different from the first isolation structure may be disposed in each of the plurality of memory blocks BLK1-BLKz. For example, each of the second isolation structures may include a conductive layer formed of a conductive material such as a metal or metal silicide, differently from the first isolation structures.

As an example, the plurality of memory blocks BLK1-BLKz may include main blocks for storing data, and at least one spare block for storing data required for operation of the semiconductor device 10. The cell region 13 may be connected to the page buffer portion 14 through bit lines BL, and may be connected to the row decoder 16 through word lines WL, string select lines SSL, and ground select lines GSL.

In an example embodiment, the cell region 13 may include a 3D memory cell array, and the 3D memory cell array may include a plurality of NAND strings. Each NAND string may include memory cells connected to word lines stacked vertically on the substrate, respectively. U.S. Pat. Nos. 7,679,133, 8,553,466, 8,654,587, 8,559,235, and U.S. Patent Application Publication No. 2011/0233648 are incorporated herein by reference in their entirety. In an example embodiment, the cell region 13 may include a two-dimensional memory cell array, and the two-dimensional memory cell array may include a plurality of NAND strings disposed in row and column directions.

The page buffer portion 14 may include a plurality of page buffers PB1-PBn (n is an integer equal to or greater than 3), and the plurality of page buffers PB1-PBn may be connected to the memory cells through the plurality of bit lines BL, respectively. The page buffer portion 14 may select at least one bit line among the bit lines BL in response to the column address Y-ADDR. The page buffer portion 14 may operate as a write driver or a sense amplifier according to an operation mode. For example, during a program operation, the page buffer portion 14 may apply a bit line voltage corresponding to data to be programmed to the selected bit line. During a read operation, the page buffer portion 14 may sense data stored in the memory cell by sensing a current or voltage of the selected bit line. Data to be programmed into the cell region 13 through a program operation and data read from the cell region 13 through a read operation may be input/output through the interface circuit 11.

The voltage generator 15 may generate various types of voltages for performing program, read, and erase operations based on the voltage control signal CTRL_vol. For example, the voltage generator 15 may generate a program voltage, a read voltage, a pass voltage, a program verify voltage, an erase voltage, and the like. In an example embodiment, the control logic circuit 12 may control the voltage generator 15 to generate a voltage for executing program, read, and erase operations using data stored in the spare block. A portion of the voltages generated by the voltage generator 15 may be input to the word lines WL as the word line voltage VWL by the row decoder 16, and another portion of the voltages may be input to the common source line by the source driver.

The row decoder 16 may select one of the plurality of word lines WL in response to the row address X-ADDR and may select one of the plurality of string select lines SSL. For example, during a program operation, the row decoder 16 may apply a program voltage and a program verify voltage to a selected word line, and during a read operation, the row decoder 16 may apply a read voltage to the selected word line.

Figure 2:
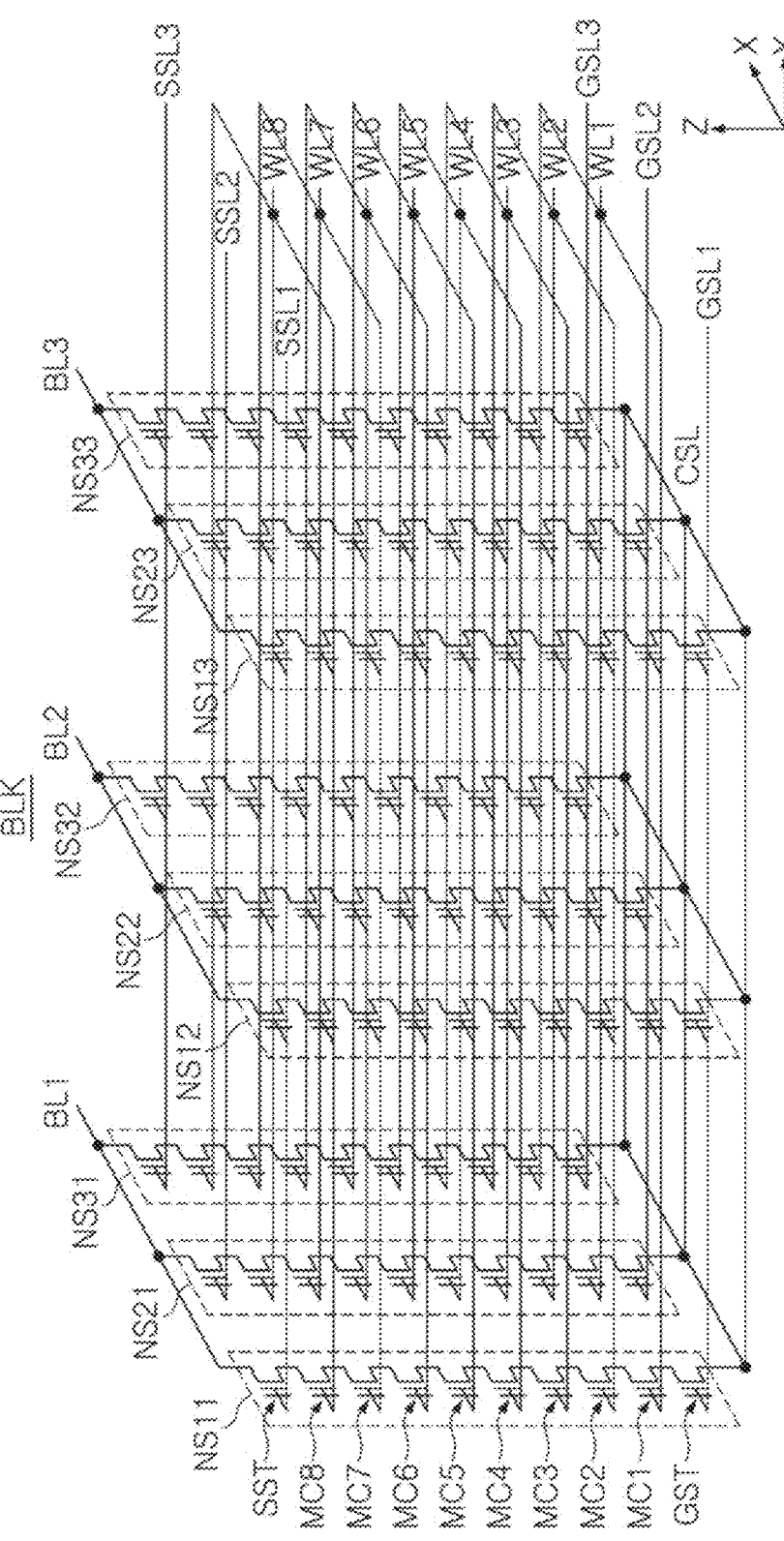
FIG. 2 is a circuit diagram illustrating a blocks included in a semiconductor device according to an example embodiment of the present disclosure.

FIG. 2 is a circuit diagram illustrating a blocks included in a semiconductor device according to an example embodiment.

The memory block BLK illustrated in FIG. 2 may be a three-dimensional memory block formed on a substrate in a three-dimensional structure. For example, the plurality of NAND strings included in the memory block BLK may be formed in a direction perpendicular to the substrate.

Figure 3:
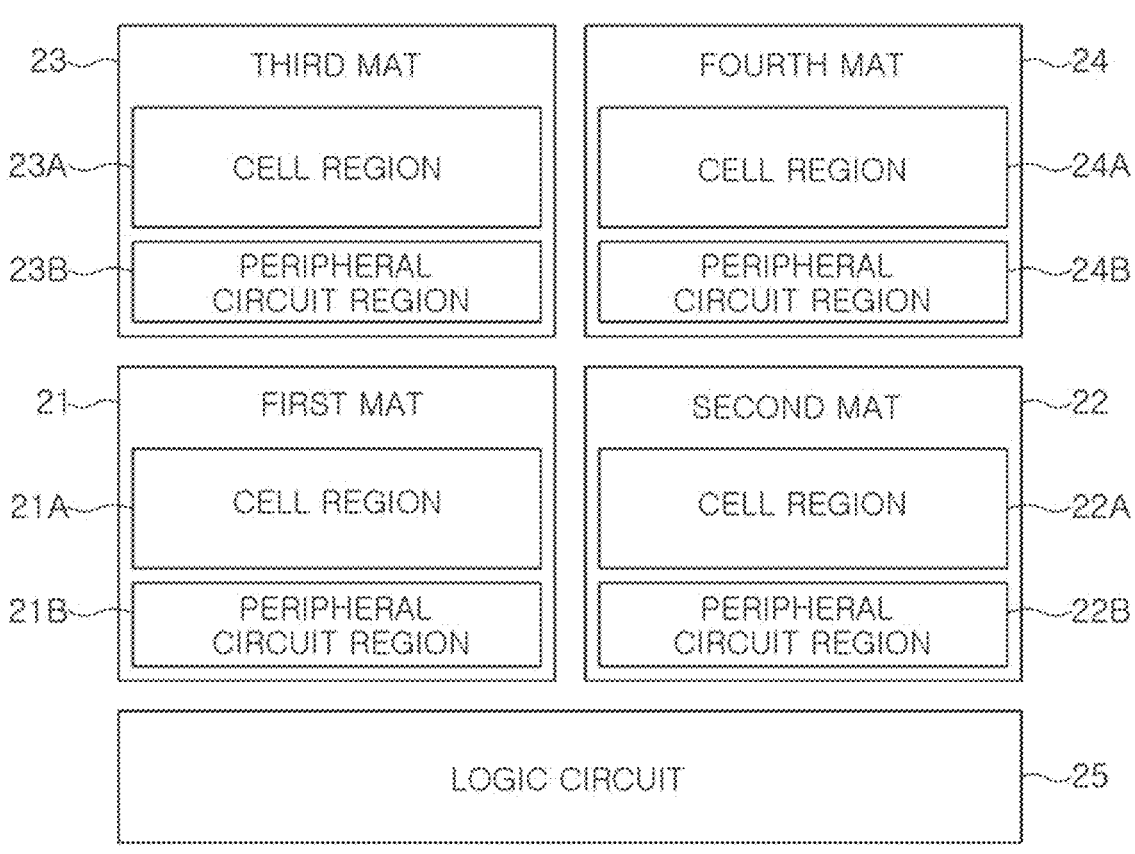
FIG. 3 is a diagram illustrating a semiconductor device according to an example embodiment of the present disclosure.

Referring to FIG. 2, the memory block BLK may include a plurality of NAND strings NS11-NS33 connected between the bit lines BL1-BL3 and the common source line CSL. Each of the plurality of NAND strings NS11-NS33 may include a string select transistor SST, a plurality of memory cells MC1-MC8, and a ground select transistor GST. In FIG. 3, each of the plurality of memory NAND strings NS11-NS33 may include eight memory cells MC1-MC8, but example embodiments are not limited thereto.

The string select transistor SST may be connected to a corresponding string select lines SSL1-SSL3. The plurality of memory cells MC1-MC8 may be connected to corresponding word lines WL1-WL8, respectively. In example embodiments, at least one of the word lines WL1 to WL8 may be provided as a dummy word line. The ground select transistor GST may be connected to corresponding ground select lines GSL1-GSL3. The string select transistor SST may be connected to corresponding bit lines BL1-BL3, and the ground select transistor GST may be connected to the common source line CSL.

The word line (e.g., WL1) on the same level may be connected in common, and the ground select lines GSL1-GSL3 and the string select lines SSL1-SSL3 may be isolated from each other. The memory block BLK may be connected to eight word lines WL1-WL8 and three bit lines BL1-BL3 in FIG. 3, but example embodiments are not limited thereto.

FIG. 3 is a diagram illustrating a semiconductor device according to an example embodiment.

Referring to FIG. 3, the semiconductor device 20 according to an example embodiment may include a plurality of mats 21-24 and a logic circuit 25. For example, each of the plurality of mats 21-24 may include the cell region 13, the page buffer portion 15, and the row decoder 16 described with reference to FIG. 1, and the logic circuit 25 may include a control logic circuit 12 and a voltage generator 15.

In example embodiments, each of the plurality of mats 21-24 may operate independently of each other. For example, while the first mat 21 executes a program operation for writing data received from an external memory controller, the logic circuit 25 may read data stored in the second mat 22 and may outputs the data to an external entity.

Each of the plurality of mats 21-24 may include a cell region and a peripheral circuit region. The cell region may include memory cells, and the peripheral circuit region may include circuits for controlling the cell region, that is, for example, a row decoder and a page buffer portion.

In an example embodiment, a cell region of each of the plurality of mats 21-24 may include a plurality of blocks. As described above, the plurality of blocks may include main blocks configured to store data and to output data in response to a command from the logic circuit 25, and a spare block configured to store data required for operation of the semiconductor device 20.

Figure 4:
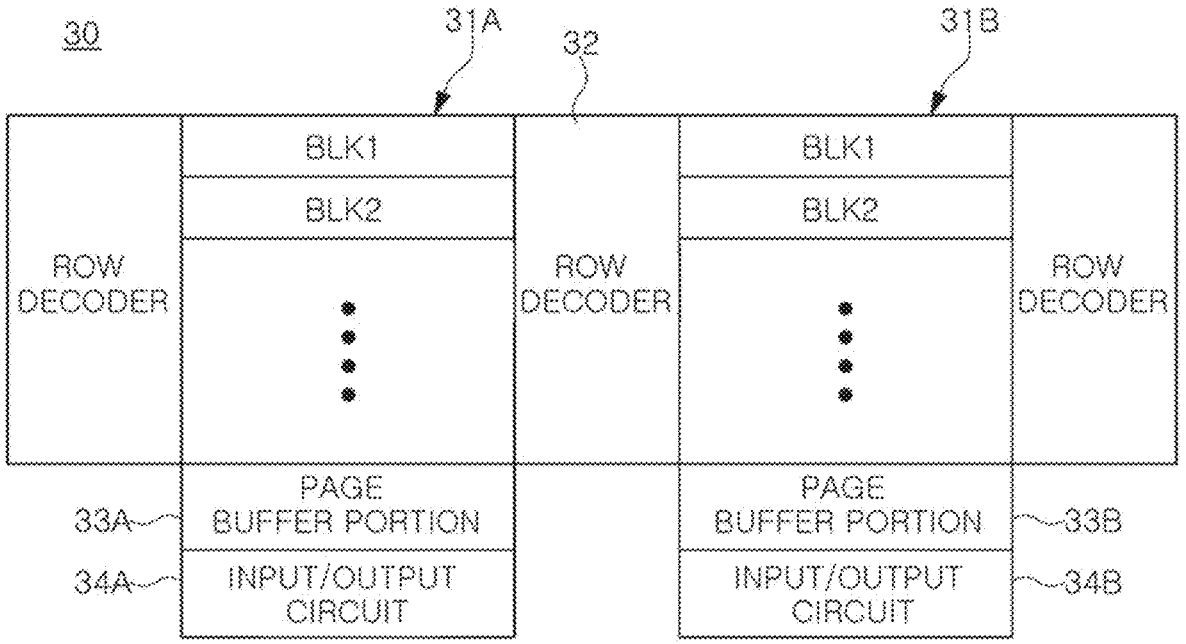
FIG. 4 is a diagram illustrating arrangement of a cell region and a peripheral circuit region in a semiconductor device according to an example embodiment of the present disclosure.

FIG. 4 is a diagram illustrating arrangement of a cell region and a peripheral circuit region in a semiconductor device according to an example embodiment.

FIG. 4 may be a diagram illustrating arrangement of a cell region and a peripheral circuit region in one of mats included in the semiconductor device 30 according to an example embodiment. Referring to FIG. 4, a peripheral circuit region may be disposed around the cell regions 31A and 31B, and for example, the row decoder 32 may be disposed on both sides of each of the cell regions 31A and 31B. The page buffers 33A and 33B may be disposed below the cell regions 31A and 31B, respectively. A direction in which each of the cell regions 31A and 31B is adjacent to the row decoder 32 may intersect a direction in which the cell regions 31A and 31B is adjacent to the page buffers 33A and 33B, respectively. The row decoder 32 and the page buffers 33A and 33B may be connected to a logic circuit controlling overall operations of the semiconductor device 30 and an input/output interface communicating with an external device through the input/output circuits 34A and 34B.

For example, word lines included in each of the cell regions 31A and 31B may extend in a horizontal direction and may be connected to the row decoder 32 adjacent to the cell regions 31A and 31B. The bit lines included in each of the cell regions 31A and 31B may extend in a vertical direction and may be connected to the page buffer portions 33A and 33B disposed below each of the cell regions 31A and 31B. In the example embodiment illustrated in FIG. 4, the cell regions 31A and 31B, the row decoder 32, the page buffers 33A and 33B, and the input/output circuits 34A and 34B may be formed on a substrate.

Figure 5:
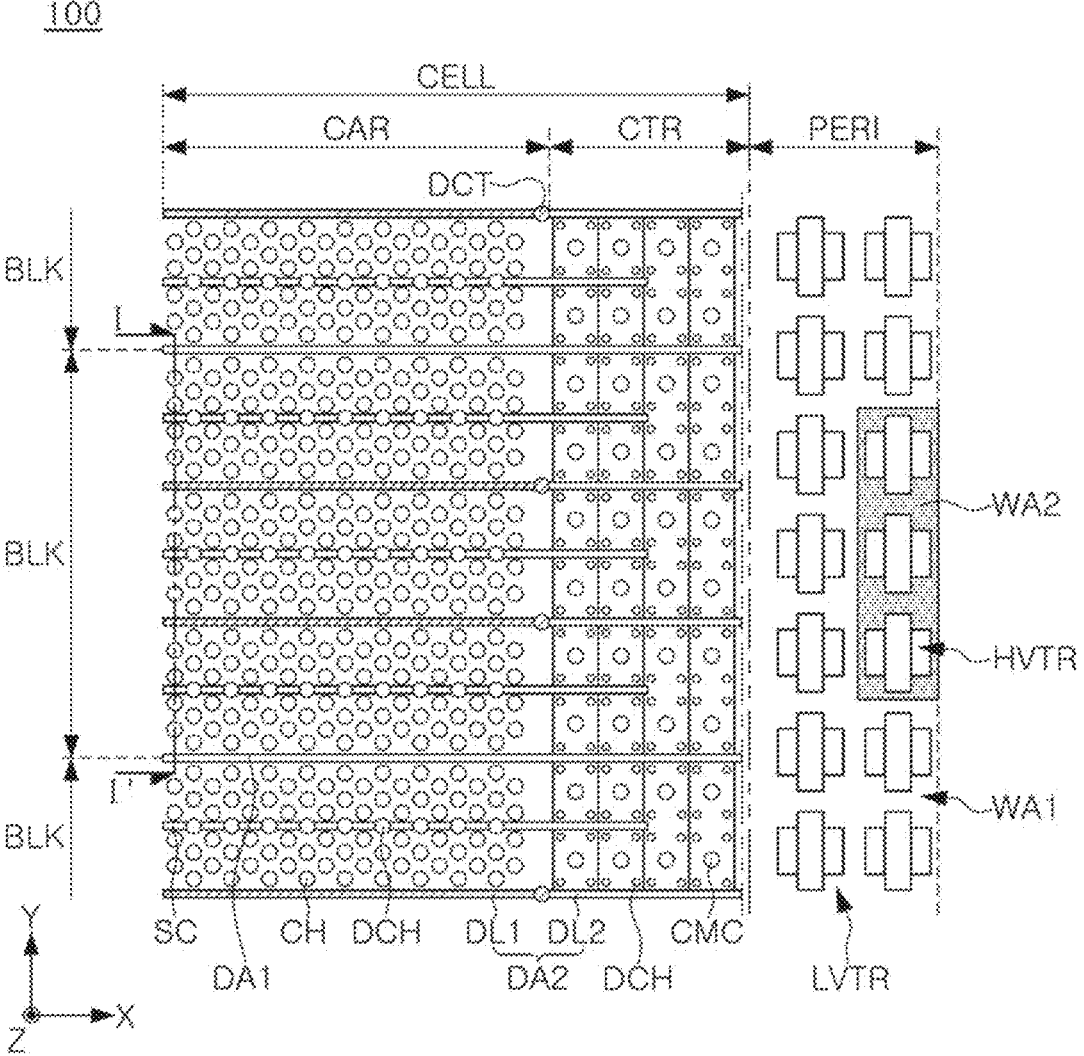
FIGS. 5 and 6 are diagrams illustrating a structure of a semiconductor device according to an example embodiment of the present disclosure.
Figure 6:
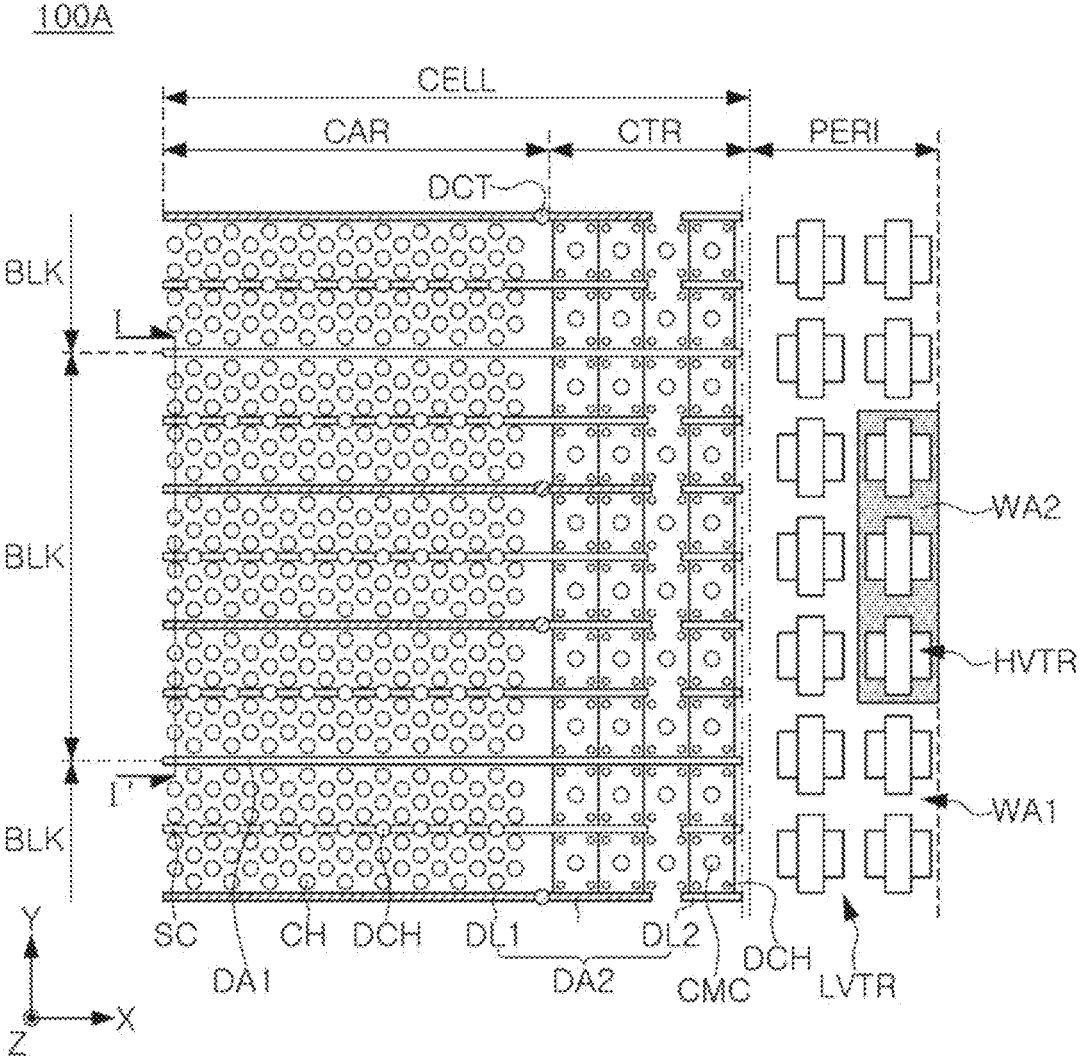

FIGS. 5 and 6 are diagrams illustrating a structure of a semiconductor device according to an example embodiment.

FIG. 5 may be a plan diagram illustrating a portion of the semiconductor device 100 according to an example embodiment. Referring to FIG. 5, the semiconductor device 100 may include a cell region CELL and a peripheral circuit region PERI, and the cell region CELL may include a cell array region CAR and a cell contact region CTR. For example, the channel structures CH may be disposed in the cell array region CAR, and the cell contacts CMC may be disposed in the cell contact region CTR. In the example embodiment in FIG. 5, the cell contact region CTR may be disposed between the cell array region CAR and the peripheral circuit region PERI.

A plurality of gate electrode layers stacked in the first direction (Z-axis direction) and a plurality of channel structures CH extending in the first direction and penetrating the plurality of gate electrode layers may be disposed in the cell region CELL. The plurality of gate electrode layers may be formed of a conductive material such as metal or metal silicide, and each of the plurality of channel structures CH may include a channel layer, a charge storage layer, a tunneling layer, and the like.

A plurality of elements LVTR and HVTR may be disposed in the peripheral circuit region PERI, and the plurality of elements LVTR and HVTR may be formed in a first well region WA1 and a second well region WA2 having different impurities properties. For example, low voltage elements LVTR may be formed in the first well region WA1, and high voltage elements HVTR may be formed in the second well region WA2. In the example embodiment in FIG. 5, at least a portion of the elements LVTR and HVTR adjacent to the cell region CELL in the second direction (X-axis direction) may be elements included in a row decoder connected to cell contacts CMC of the cell contact region CTR.

As illustrated in FIG. 5, the cell region CELL may include a plurality of blocks BLK, and the plurality of blocks BLK may be divided by a plurality of first isolation structures DA1 extending in the second direction and may be arranged in a third direction (Y-axis direction). Each of the plurality of first isolation structures DA1 may extend in the second direction and may cross the cell region CELL, and may include only an insulating material. For example, each of the plurality of first isolation structures DA1 may be formed of silicon oxide, silicon nitride, or the like.

At least one of the plurality of second isolation structures DA2 may be disposed in each of the plurality of blocks BLK. The plurality of second isolation structures DA2 may extend in the second direction similarly to the plurality of first isolation structures DA1, and may be disposed in one of the plurality of blocks BLK, rather than being disposed on a boundary between the plurality of blocks BLK. In the example embodiment in FIG. 5, each of the plurality of blocks BLK may include two second isolation structures DA2, but the number of second isolation structures DA2 included in each of the plurality of blocks BLK may be varied in example embodiments.

In the example embodiment illustrated in FIG. 5, an upper isolation layer SC may be formed between a pair of second isolation structures DA2 adjacent to each other in the third direction among the plurality of second isolation structures DA2. The upper isolation layer SC may extend in the second direction, and may divide a portion of gate electrode layers disposed on an upper portion of the plurality of gate electrode layers into a plurality of electrode layers in the third direction. For example, the upper isolation layer SC may divide the gate electrode layers providing a string select line in the third direction, and accordingly, the upper isolation layer SC may be shorter than the plurality of first isolation structures DA1 and the plurality of second isolation structures DA2 in the second direction.

Each of the plurality of second isolation structures DA2 may include a first line DL1 and a second line DL2, and the first line DL1 and the second line DL2 may have different structures. For example, the first line DL1 may include both an insulating material and a conductive material, and the second line DL2 may include only an insulating material. The insulating material included in each of the first line DL1 and the second line DL2 may be the same material, and in an example embodiment, the insulating material may be silicon oxide, silicon nitride, or the like.

For example, each of the plurality of first isolation structures DA1 may include only a first vertical insulating layer extending in the first direction and the second direction, and each of the plurality of second isolation structures DA2 may further include a conductive layer in addition to the second vertical insulating layer. Each of the first vertical insulating layer and the second vertical insulating layer may be a single insulating layer or may include a plurality of insulating layers. For example, in each of the plurality of second isolation structures DA2, the conductive layer may be disposed in the second vertical insulating layer, and accordingly, the conductive layer may be isolated from the plurality of gate electrode layers without being electrically connected to the plurality of gate electrode layers in the third direction.

A boundary between the first line DL1 and the second line DL2 may be similar to a boundary between the cell array region CAR and the cell contact region CTR. The first line DL1 may be adjacent to the channel structures CH in the second direction. A isolation structure contact DCT may be formed adjacent to a boundary between the first line DL1 and the second line DL2, and the isolation structure contact DCT may connect a conductive layer formed of a conductive material on the first line DL1 to a metal wiring on the cell region CELL. The conductive layer may be connected to at least one of the elements LVTR and HVTR disposed in the peripheral circuit region PERI through a metal wiring on the cell region CELL.

In an example embodiment, the conductive layer included in each of the plurality of second isolation structures DA2 may be connected to at least one of the high voltage elements HVTR formed in the second well region WA2 of the peripheral circuit region PERI. When a voltage is applied to the conductive layer by the high voltage device HVTR, heat may be generated in the conductive layer, and the semiconductor device 100 may use heat generated from the conductive layer to compensate for deterioration of the memory cells disposed in the cell array region CAR or may increase a voltage margin generated in the memory cells by a program operation.

Among the plurality of isolation structures DA1 and DA2 included in the semiconductor device 100, a pair of isolation structures most adjacent to each other in the third direction may be defined to include the first isolation structure DA1 and the second isolation structure DA2 depending on positions thereof. Accordingly, one of the pair of isolation structures most adjacent to each other in the third direction may include only the insulating layer, and the other may include both the insulating layer and the conductive layer. Also, since the isolation structures most adjacent to one isolation structure including only the insulating layer in the third direction may be second isolation structures DA2, each of the isolation structures may include a conductive layer.

FIG. 6 may be a plan diagram illustrating a portion of the semiconductor device 100A according to an example embodiment. Referring to FIG. 6, the semiconductor device 100A may include a cell region CELL and a peripheral circuit region PERI, and the cell region CELL may include a cell array region CAR and a cell contact region CTR. Channel structures CH extending in the first direction (Z-axis direction) may be disposed in the cell array region CAR, and cell contacts CMC may be disposed in the cell contact region CTR. The structure of the semiconductor device 100A may be similar to the structure of the semiconductor device 100 described in the aforementioned example embodiment with reference to FIG. 5.

However, in the example embodiment illustrated in FIG. 6, each of the plurality of second isolation structures DA2 disposed in each of the plurality of blocks BLK may be divided into a first line DL1 and a second line DL2 in the second direction (X-axis direction). Differently from the example embodiment illustrated in FIG. 5 in which the first line DL1 and the second line DL2 is in contact with each other in each of the plurality of second isolation structures DA2, in the example embodiment illustrated in FIG. 6, the first line DL1 and the second line DL2 may be isolated from each other without being connected to each other in the second direction.

Accordingly, a portion of the plurality of gate electrode layers may be connected as a single layer in each of the plurality of blocks BLK through the first line DL1 and the second line DL2. For example, among the plurality of gate electrode layers, gate electrode layers providing a plurality of word lines may be connected to each other between the first line DL1 and the second line DL2. For example, the gate electrode layer disposed on the first level and providing one of the word lines may not be divided into a plurality of regions in the third direction (Y-axis direction) in each of the plurality of blocks BLK, whereas the gate electrode layers providing a string select line may be divided into a plurality of regions in the third direction by the first line DL1 and the upper isolation layer SC in each of the plurality of blocks BLK.

In the example embodiment illustrated in FIG. 6, the first line DL1 may be defined as a region isolated from the second line DL2 in the second direction in each of the plurality of second isolation structures DA2. Accordingly, as compared to the example embodiment illustrated in FIG. 5, the first line DL1 may extend relatively longer in the second direction. An isolation structure contact DCT may be connected to the first line DL1, and a position of the isolation structure contact DCT may be varied in example embodiments.

Figure 7:
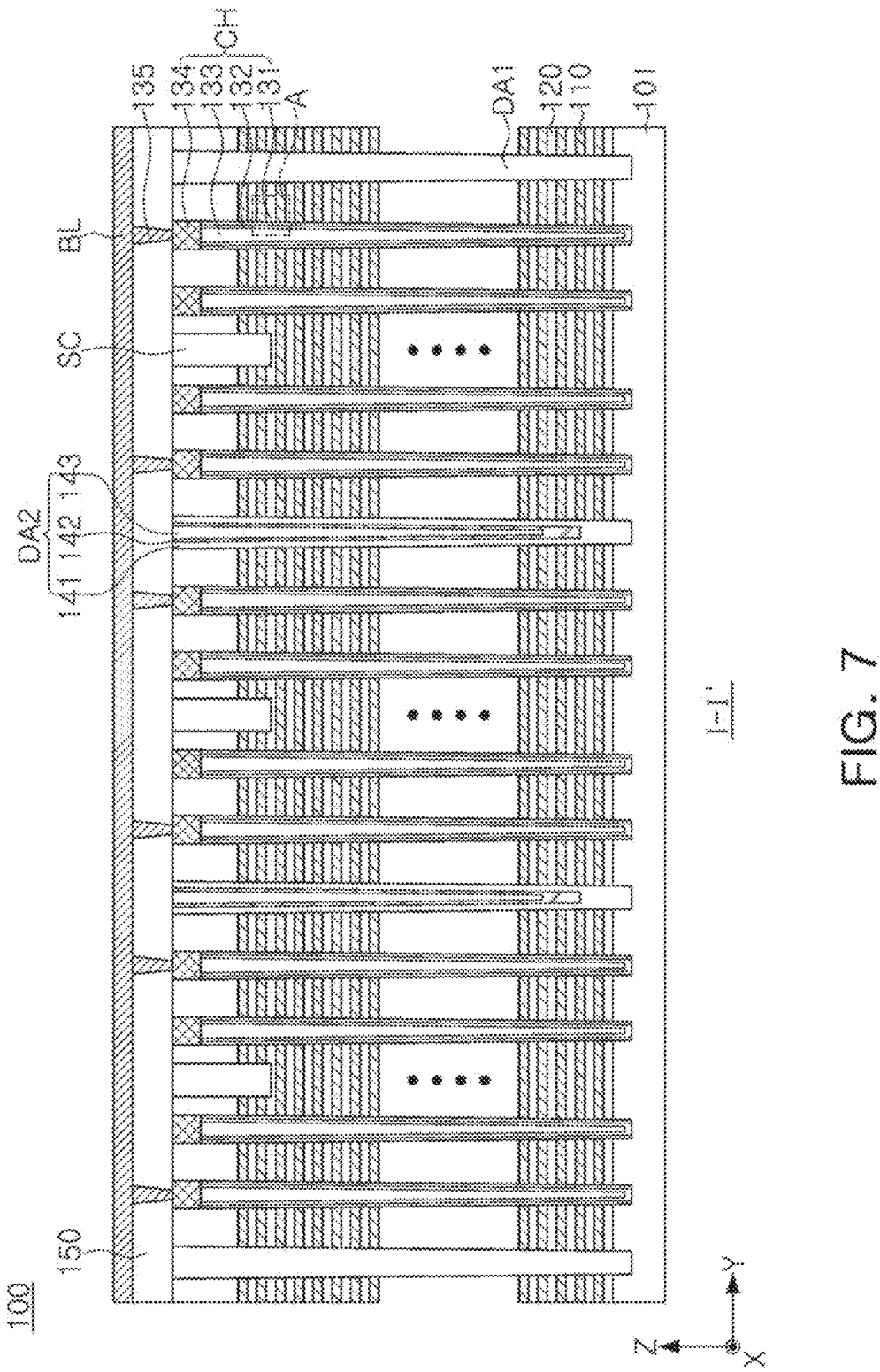
FIG. 7 is a cross-sectional diagram taken along line I-I' in FIG. 5.

FIG. 7 is a cross-sectional diagram taken along line I-I' in FIG. 5.

Referring to FIGS. 5 and 7 together, the semiconductor device 100 may include a plurality of gate electrode layers 110 and a plurality of insulating layers 120 stacked in a first direction (Z-axis direction) perpendicular to an upper surface of the substrate 101, and channel structures CH extending in the first direction and penetrating the gate electrode layers 110 and the insulating layers 120. Each of the channel structures CH may include a channel layer 132 connected to the substrate 101, a gate dielectric layer 131 disposed between the channel layer 132 and the gate electrode layers 110, a filling insulating layer 133 disposed in the channel layer 132, and a drain region 134 on the channel layer 132. An interlayer insulating layer 150 may be disposed on the plurality of gate electrode layers 110.

The gate dielectric layer 131 may include a tunneling layer, a charge storage layer, and a blocking layer. For example, at least one of the tunneling layer, the charge storage layer, and the blocking layer may be configured to surround the gate electrode layers 110. The drain region 134 may be connected to at least one of the bit lines BL through the bit line contact 135, and the bit lines BL may be connected to a page buffer formed in the peripheral circuit region PERI. The bit lines BL may extend in a third direction (Y-axis direction).

As illustrated in FIG. 7, the plurality of gate electrode layers 110 may be divided into a plurality of regions in the third direction by the plurality of first isolation structures DA1 and the plurality of second isolation structures DA2 arranged in a third direction extending in the second direction (X-axis direction). Also, an upper isolation layer SC dividing a portion of gate electrode layers 110 disposed on an upper portion in the first direction may be disposed between a pair of isolation structures adjacent to each other among the plurality of first isolation structures DA1 and the plurality of second isolation structures DA2.

Referring to FIG. 7, the plurality of first isolation structures DA1 and the plurality of second isolation structures DA2 may have different structures. Each of the plurality of first isolation structures DA1 may include only an insulating material, that is, for example, only a first vertical insulating layer. Each of the plurality of second isolation structures DA2 may include a plurality of layers, and at least one of the plurality of layers may include a conductive material. In the example embodiment in FIG. 7, each of the plurality of second isolation structures DA2 may include a second vertical insulating layer 141, a conductive layer 142, and a third vertical insulating layer 143. The second and third vertical insulating layers 141 and 143 may be formed of the same insulating material as that of the first vertical insulating layer, such as, for example, silicon oxide, silicon nitride, silicon oxynitride, or the like.

The conductive layer 142 may be formed of a metal material such as tungsten, and may have a U-shape in the example embodiment illustrated in FIG. 7. The conductive layer 142 having a U-shape may include a first conductive region and a second conductive region extending in the first direction and the second direction and parallel to each other, and a third conductive region connecting the first conductive region to the second conductive region in a lower portion. The third vertical insulating layer 143 may be formed in a space between the first conductive region and the second conductive region in the third direction.

The conductive layer 142 may be electrically isolated from the plurality of gate electrode layers 110 in the third direction by the second vertical insulating layer 141. The second vertical insulating layer 141 disposed on an external side of the conductive layer 142 may include a first region in contact with the conductive layer 142 in a third direction and a second region disposed below the conductive layer 142 in the first direction. Referring to FIG. 7, a width of the first region in the third direction may be smaller than a thickness of the second region in the first direction.

The second vertical insulating layer 141 included in each of the plurality of second isolation structures DA2 may be formed by a process of filling trench with an insulating material. In the process of filling the trench with the insulating material, the insulating material may conformally fill the trench. In other words, an insulating material may be simultaneously filled in a side surface and a lower surface of an internal portion of the trench, such that the insulating material may be relatively greatly deposited on the lower surface of the internal portion of the trench, and as illustrated in FIG. 7, the width of the first region may be smaller than a thickness of the second region.

A level of the lower surface of the conductive layer 142 included in each of the plurality of second isolation structures DA2 may be varied depending on the thickness of the second region. The thickness of the second region and the corresponding position of the lower surface of the conductive layer 142 will be described with reference to FIGS. 11A and 11B.

As described above with reference to FIGS. 5 and 6, the conductive layer 142 may be connected to the peripheral circuit region PERI through the isolation structure contact DCT. For example, the conductive layer 142 may be connected to a row decoder disposed in the peripheral circuit region PERI.

In an example embodiment, when the semiconductor device 100 performs a program operation for writing data, a row decoder may apply a voltage to the conductive layer 142 in the block including the selected memory cell in which data is written. Heat may be generated in the conductive layer 142 by the voltage applied by the row decoder, and electric charges may be moved effectively in the program operation, thereby increasing a change in threshold voltage of the selected memory cell by the program operation. Accordingly, a voltage margin of the memory cells may increase, thereby improving performance of the semiconductor device 100.

In an example embodiment, when the number of times of use of a specific block among the plurality of blocks BLK included in the semiconductor device 100 exceeds a reference number of times of use, a desired and/or alternatively predetermined level of voltage may be applied to the conductive layer 142 disposed in the corresponding block. For example, the number of times of use may include the number of executions of a program operation and an erase operation for the corresponding block. By applying a voltage to the conductive layer 142, heat may be generated in the conductive layer 142, and deterioration of the properties of the memory cells due to the accumulation of the number of times of use of the corresponding block may be compensated for using the heat generated in the conductive layer 142. Hereinafter, this configuration will be described in greater detail with reference to FIG. 8.

Figure 8:
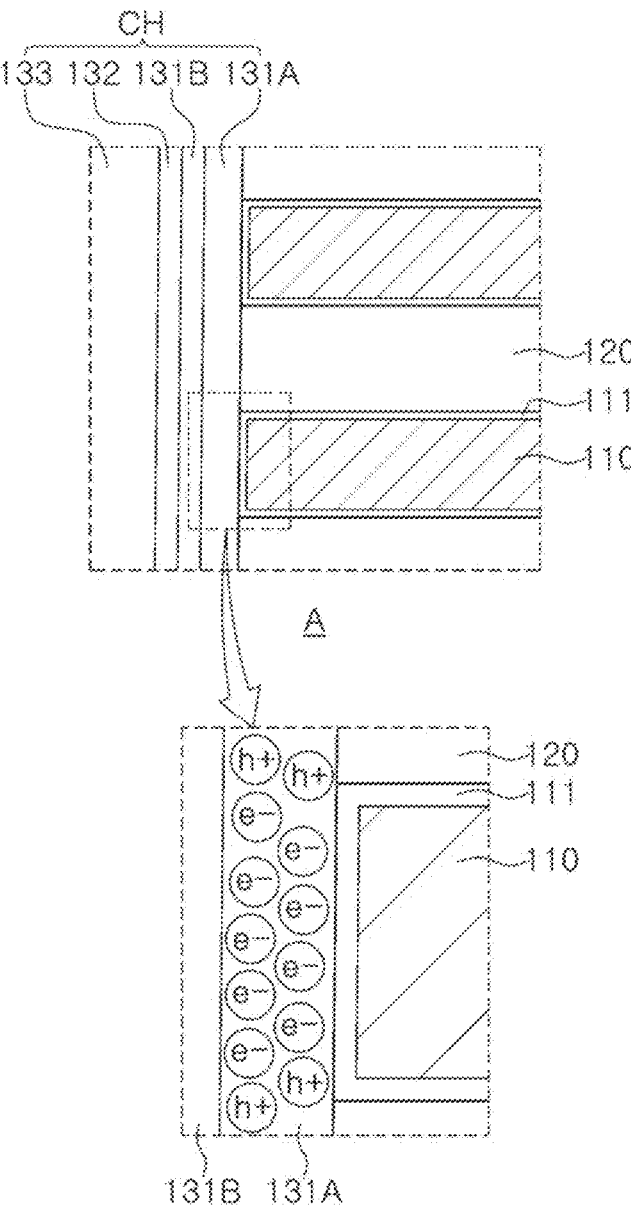
FIG. 8 is a diagram illustrating operations of a semiconductor device according to an example embodiment of the present disclosure.

FIG. 8 is a diagram illustrating operations of a semiconductor device according to an example embodiment.

As an example, FIG. 8 may be an enlarged diagram illustrating region A in FIG. 7. Referring to FIGS. 7 and 8 together, a plurality of gate electrode layers 110 and a plurality of insulating layers 120 may be alternately stacked, and a blocking layer 111 surrounding each of the plurality of gate electrode layers 110 may be disposed. The channel structure CH may include a charge storage layer 131A, a tunneling layer 131B, a channel layer 132, and a filling insulating layer 133.

In a program operation, electric charges may move from the channel layer 132 to the charge storage layer 131A by applying a high program voltage to the gate electrode layer 110 providing the selected memory cell to which data is to be written. As charges are trapped in the charge storage layer 131A, a threshold voltage of the selected memory cell may change, and electric charges trapped in the charge storage layer 131A may be mainly electrons e−.

In an erase operation, a high erase voltage may be input to the substrate 101. Since the channel layer 132 is connected to the substrate 101, electrons e-trapped in the charge storage layer 131A may be removed by the erase voltage input to the substrate 101. In this case, holes h+ may move from the channel layer 132 to the charge storage layer 131A by the erase voltage.

As illustrated in FIG. 8, the channel layer 132 and the charge storage layer 131A may extend in the first direction (Z-axis direction), and a portion of the channel layer 132 and the charge storage layer 131A may be adjacent to the plurality of insulating layers 120 on a side surface, and the other region may be adjacent to the plurality of gate electrode layers 110 on a side surface. Partial regions of the channel layer 132 and the charge storage layer 131A adjacent to the plurality of insulating layers 120 may be relatively less affected by a program voltage input to at least one of the plurality of gate electrode layers 110 in the program operation. Accordingly, as the program operation and the erase operation are repeatedly executed, holes h+ may be accumulated in partial regions of the channel layer 132 and the charge storage layer 131A adjacent to the plurality of insulating layers 120, which may deteriorate properties of memory cells included in the semiconductor device 100.

In an example embodiment, when the number of times of use of a specific block among the plurality of blocks BLK is accumulated by more than a desired and/or alternatively predetermined reference number of times of use, heat may be generated in the conductive layer 142 by inputting a desired and/or alternatively predetermined voltage to the conductive layer 142 of each of the second isolation structures DA disposed in the corresponding block. Heat generated in the conductive layer 142 may affect the charge storage layer 131A in the adjacent channel structures CH. Accordingly, due to heat from the conductive layer 142, charge carriers trapped in the charge storage layer 131A may escape from the charge storage layer 131A as the number of times of use is accumulated, and deterioration of properties of the memory cells may be compensated for.

When a voltage is applied to the conductive layer 142 in a program operation, more electric charges may be trapped in the charge storage layer 131A due to heat generated in the conductive layer 142. Accordingly, even when the same program voltage is input to the gate electrode layer 110, the threshold voltage of the memory cell may increase significantly. Alternatively, by lowering the level of the program voltage input to the gate electrode layer 110 during the program operation, power consumption of the semiconductor device 100 may be reduced.

Figure 9:
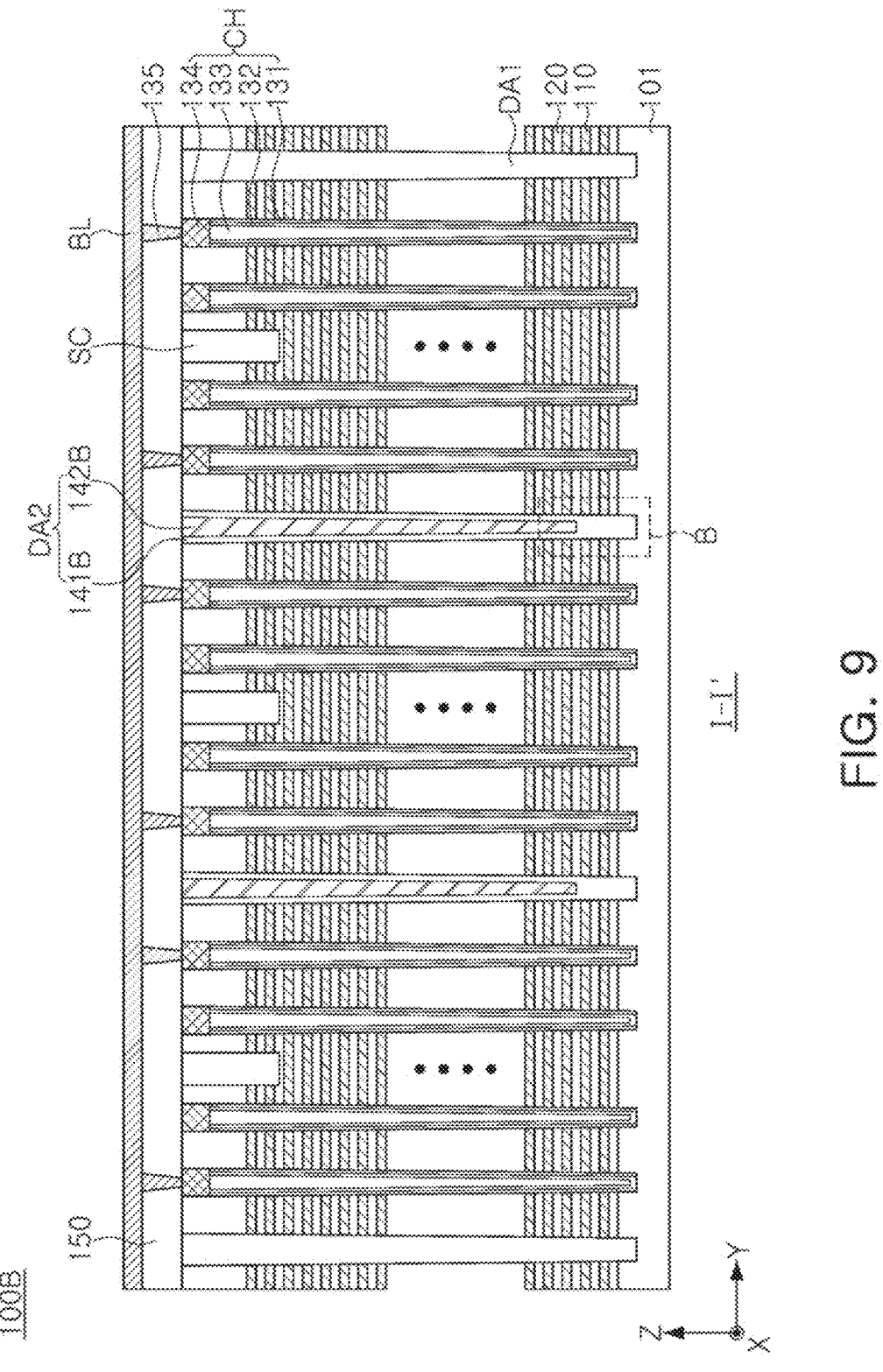
FIGS. 9 and 10 are diagrams illustrating a structure of a semiconductor device according to an example embodiment of the present disclosure.
Figure 10:
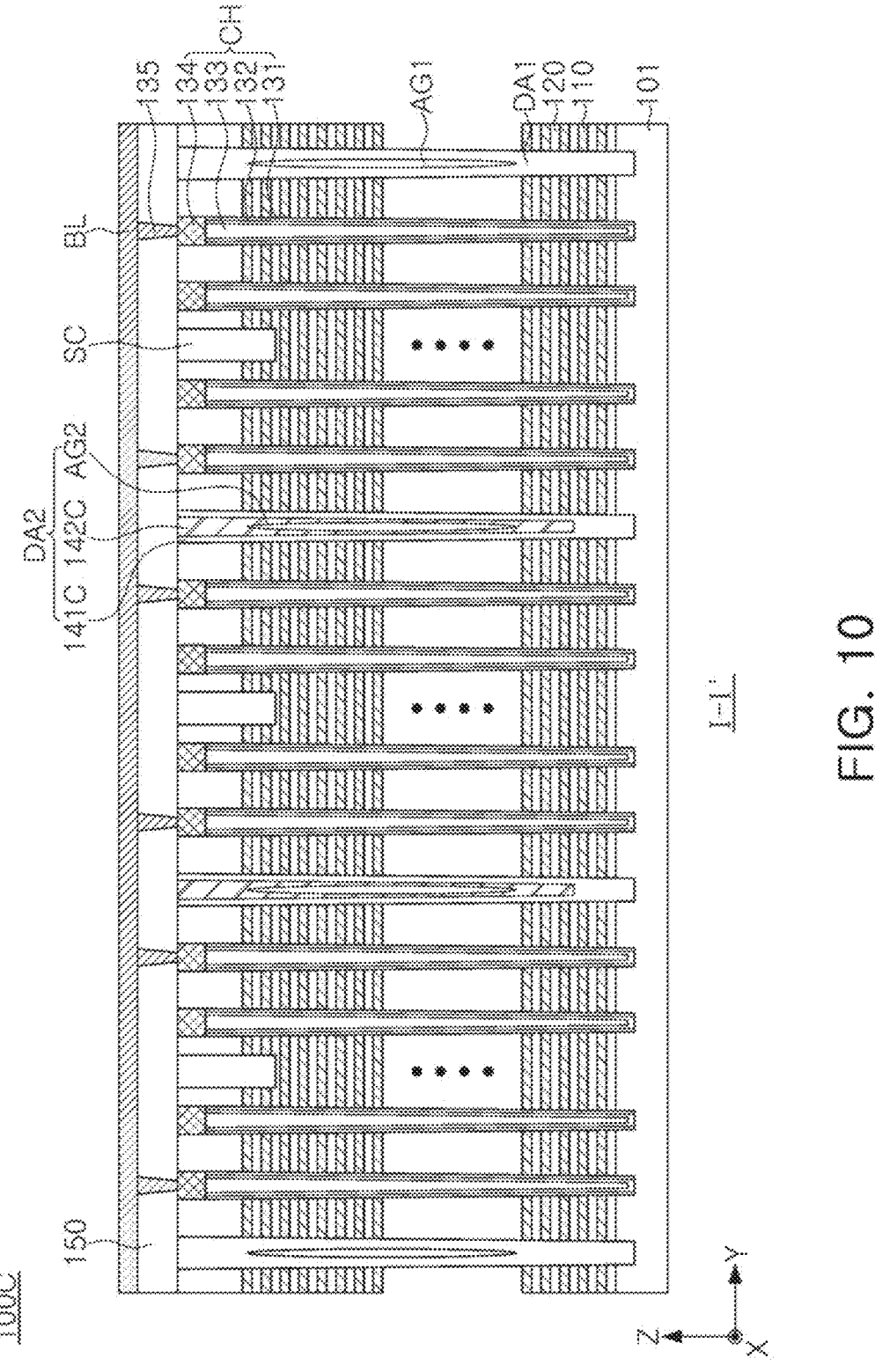

FIGS. 9 and 10 are diagrams illustrating a structure of a semiconductor device according to an example embodiment.

FIGS. 9 and 10 may be diagrams illustrating cross-sectional surfaces of semiconductor devices 100B and 100C according to an example embodiment. Referring to FIGS. 9 and 10, each of the semiconductor devices 100B and 100C may include a plurality of gate electrode layers 110 and a plurality of insulating layers 120 stacked in a first direction (Z-axis direction) perpendicular to an upper surface of a substrate 101, and channel structures CH extending in the first direction and penetrating the gate electrode layers 110 and the insulating layers 120. Each of the channel structures CH may include a channel layer 132 connected to the substrate 101, a gate dielectric layer 131 disposed between the channel layer 132 and the gate electrode layers 110, a filling insulating layer 133 in the channel layer 132, and a drain region 134 on the channel layer 132.

As illustrated in FIGS. 9 and 10, the plurality of gate electrode layers 110 may be divided into a plurality of regions in the third direction by a plurality of first isolation structures DA1 and a plurality of second isolation structures DA2 arranged in the third direction and extending in the second direction (X-axis direction). Also, upper isolation layer SC dividing a portion of gate electrode layers 110 disposed on an upper portion in the first direction may be disposed between a pair of isolation structures adjacent to each other among the plurality of first isolation structures DA1 and the plurality of second isolation structures DA2.

Referring to FIG. 9, each of the plurality of first isolation structures DA1 may include a first vertical insulating layer, and the plurality of second isolation structures DA2 may include a second vertical insulating layer 141B and a conductive layer 142B. In the example embodiment in FIG. 9, a space in the second vertical insulating layer 141B may be filled with the conductive layer 142B.

Thereafter, referring to FIG. 10, air gaps AG1 and AG2 may be formed in at least one of the plurality of first isolation structures DA1 and the plurality of second isolation structures DA2. Referring to FIG. 10, a first air gap AG1 may be formed in each of the plurality of first isolation structures DA1, and a second air gap AG2 may be formed in a conductive layer 142C of each of the plurality of second isolation structures DA2. Accordingly, each of the plurality of second isolation structures DA2 may include the second vertical insulating layer 141C, the conductive layer 142C, and the second air gap AG2.

However, in the example embodiment illustrated in FIG. 10, the air gaps AG1 and AG2 may not be formed in both the plurality of first isolation structures DA1 and the plurality of second isolation structures DA2. In other words, the air gaps AG1 and AG2 may be formed only in a portion of the plurality of first isolation structures DA1 and the plurality of second isolation structures DA2, and the air gaps AG1 and AG2 may not be formed in the other portion of the plurality of first isolation structures DA1 and DA2. The air gaps AG1 and AG2 may be formed during a process in which an insulating material and a conductive material are conformally deposited in the trench for forming the plurality of first isolation structures DA1 and the plurality of second isolation structures DA2.

The structure of the plurality of first isolation structures DA1 and the plurality of second isolation structures DA2 included in the semiconductor devices 100B and 100C described with reference to FIGS. 9 and 10 may be interchangeably applied with the structure of the plurality of first isolation structures DA1 and the plurality of second isolation structures DA2 included in the semiconductor device 100 described with reference to FIG. 7. For example, at least one of the plurality of first isolation structures DA1 may include a first air gap AG1, and each of the plurality of second isolation structures DA2 may have the U-shaped conductive layer 142 as illustrated in FIG. 7 and may not include the second air gap AG2.

Figure 11A:
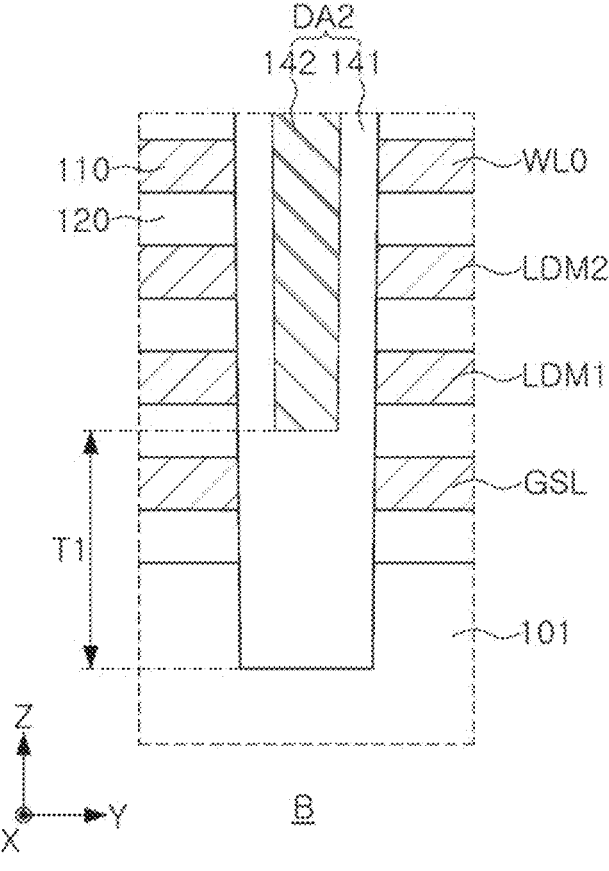
FIGS. 11A and 11B are diagrams illustrating a structure of a semiconductor device according to an example embodiment of the present disclosure.
Figure 11B:
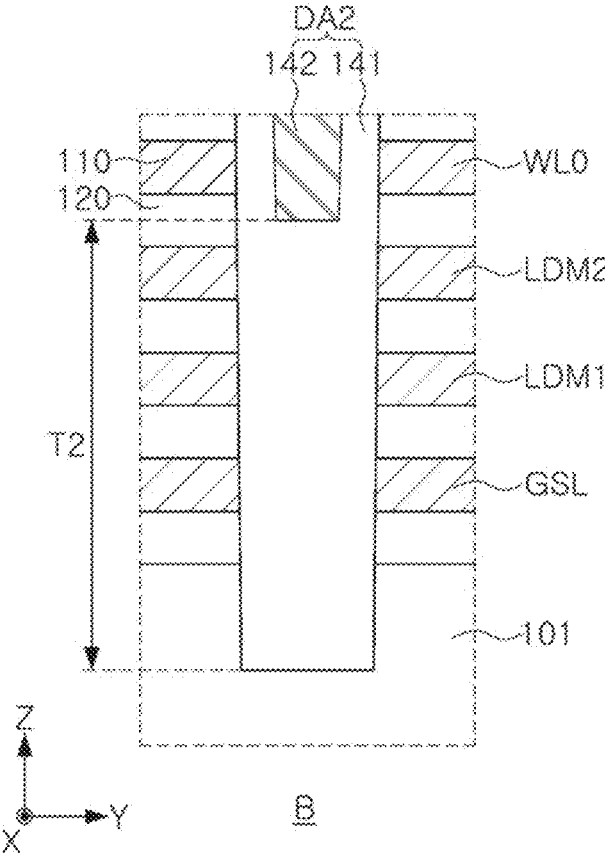

FIGS. 11A and 11B are diagrams illustrating a structure of a semiconductor device according to an example embodiment.

FIGS. 11A and 11B may be enlarged diagrams illustrating region B in FIG. 9. Referring to FIGS. 11A and 11B, the semiconductor device may include a substrate 101, a plurality of gate electrode layers 110 and a plurality of insulating layers 120 alternately stacked on the substrate, and a plurality of second divided regions DA2. Each of the plurality of second division regions DA2 may include a second vertical insulating layer 141 and a conductive layer 142.

The plurality of gate electrode layers 110 stacked in sequence from the substrate 101 may provide a ground select line GSL, a first lower dummy line LDM1, a second lower dummy line LDM2, and a first word line WL0. In example embodiments, a dummy line may be further disposed between the ground select line GSL and the substrate 101, and the number of dummy lines disposed between the ground select line GSL and the first word line WL0 may also be varied.

In the example embodiment in FIG. 11A, the second vertical insulating layer 142 may have a first thickness T1 in a region below the conductive layer 142 in the first direction (Z-axis direction). Also, the lower surface of the conductive layer 142 may be disposed on a level higher than a level of an upper surface of the ground select line GSL and lower than a level of a lower surface of the first lower dummy line LDM1 in the first direction.

In the example embodiment illustrated in FIG. 11B, the second vertical insulating layer 142 may have a second thickness T2 in a region below the conductive layer 142 in the first direction. The second thickness T2 may be greater than the first thickness T1. Referring to FIG. 11B, the lower surface of the conductive layer 142 may be disposed between the lower surface of the first word line WL0 and the upper surface of the second lower dummy line LDM2.

The position of the lower surface of the conductive layer 142 is not necessarily limited as in the example embodiments illustrated in FIGS. 11A and 11B. In example embodiments, the lower surface of the conductive layer 142 may be disposed between the first lower dummy line LDM1 and the second lower dummy line LDM2. Also, in the example embodiments illustrated in FIGS. 11A and 11B, the lower surface of the conductive layer 142 may be disposed on the same level as a level of one of the plurality of insulating layers 120 in the first direction, but differently from the example embodiment, the lower surface of the 142 may be disposed on the same level as a level of one of the plurality of gate electrode layers 110 in the first direction.

In at least a portion of the plurality of second isolation structures DA2 included in one semiconductor device, the lower surfaces of the conductive layers 142 may be disposed on different levels. For example, in one of the plurality of second isolation structures DA2, the lower surface of the conductive layer 142 may be disposed between the ground select line GSL and the first lower dummy line LDM1, and in the other one of the plurality of second isolation structures DA2, the lower surface of the conductive layer 142 may be disposed between the first lower dummy line LDM1 and the second lower dummy line LDM2.

Figure 12:
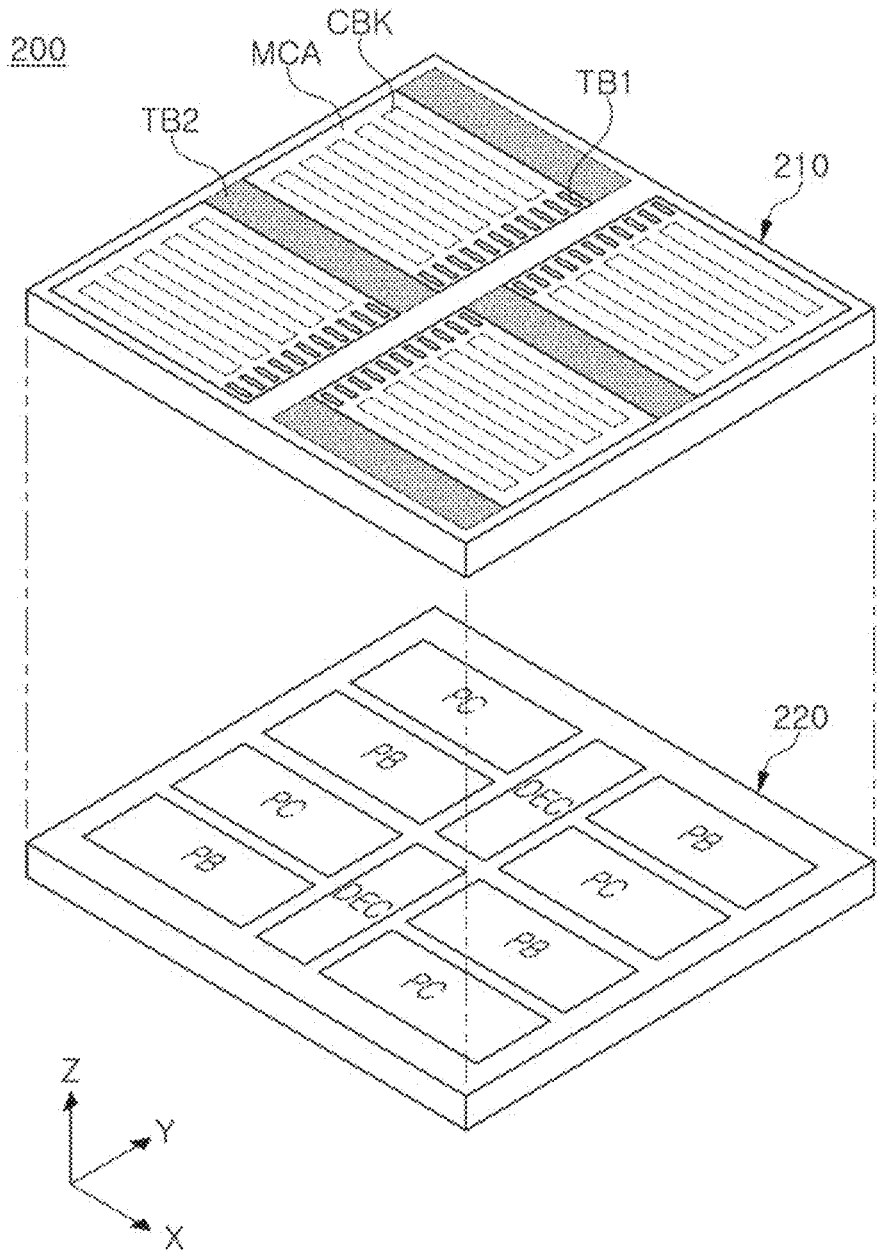
FIG. 12 is a diagram illustrating a structure of a semiconductor device according to an example embodiment of the present disclosure.

FIG. 12 is a diagram illustrating a structure of a semiconductor device according to an example embodiment.

Referring to FIG. 12, a semiconductor device 200 may include a first region 210 and a second region 220 stacked in a first direction (Z-axis direction). The first region 210 may be a cell region, and the second region 220 may be a peripheral circuit region. The first region 210 may include memory cell arrays MCA and first and second through wiring regions TB1 and TB2 formed on the first substrate. Through wirings connecting the first region 210 to the second region 220 and extending in a vertical direction may be disposed in each of the first and second through wiring regions TB1 and TB2.

Each of the memory cell arrays MCA may include a plurality of blocks BLK. The plurality of blocks BLK may extend in the second direction (X-axis direction) and may be arranged in the third direction (Y-axis direction). The plurality of blocks BLK may be divided by a plurality of first isolation structures extending in the second direction, and a plurality of second isolation structures may be disposed in each of the plurality of blocks BLK.

In example embodiments, the plurality of blocks BLK may include at least one dummy block and at least one spare block. Memory cells for storing data in the semiconductor device 200 may not be disposed in the dummy block. The spare block may include a memory cell similarly to the other blocks BLK, and may store data when properties of the other blocks BLK are deteriorated or a deterioration compensation operation is performed on the blocks BLK.

The second region 220 may include a row decoder DEC, a page buffer PB, and a peripheral circuit PC formed on the second substrate. For example, the peripheral circuit PC may include a voltage generator, a source driver, an input/output circuit, and the like. The row decoder DEC and the page buffer PB may be connected to the first region 210 through the first and second through wiring regions TB1 and TB2.

In each of the plurality of blocks BLK, at least one of the plurality of second isolation structures may include a conductive layer formed of a conductive material. The conductive layer may be formed of a metal material such as tungsten, and may be electrically connected to the row decoder DEC of the second region 220.

For example, when the number of times of use of a specific block among the plurality of blocks BLK exceeds a desired and/or alternatively predetermined reference number of times, the row decoder DEC may apply a voltage to the conductive layer of the second isolation structures included in the block. Heat may be generated in the conductive layer by the voltage applied by the row decoder DEC. By the heat generated in the conductive layer, electric charges trapped in the charge storage layer of the memory cells adjacent to the conductive layer in the third direction may be effectively removed, and deterioration of properties of the memory cells due to an increase in the number of times of uses may be compensated for.

Also, in an example embodiment, the semiconductor device 200 may generate heat in the conductive layer using the row decoder DEC during a program operation. By performing the program operation while generating heat in the conductive layer included in the block in which the selected memory cells, which are the target of the program operation, are disposed, a threshold voltage of the selected memory cells may be further changed. Accordingly, a larger voltage margin of the selected memory cells may be secured after the program operation, and performance of the semiconductor device 200 may improve.

Figure 13:
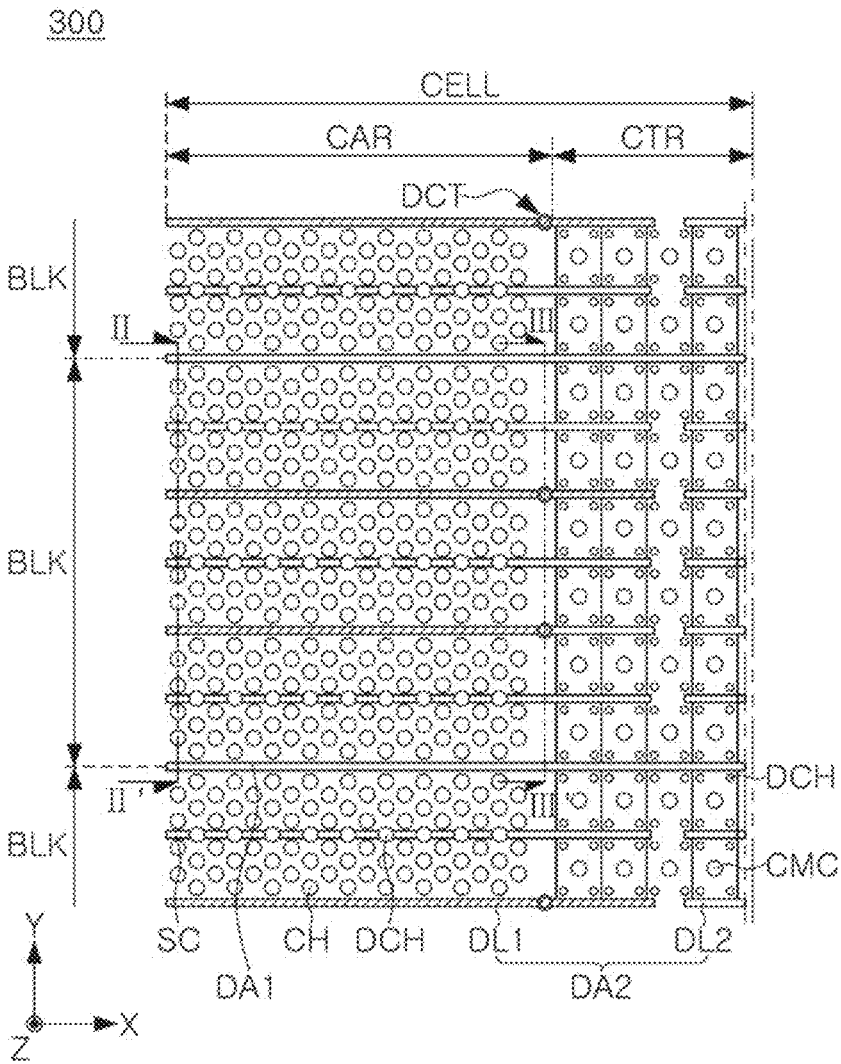
FIG. 13 is a diagram illustrating a structure of a semiconductor device according to an example embodiment of the present disclosure.
Figure 14:
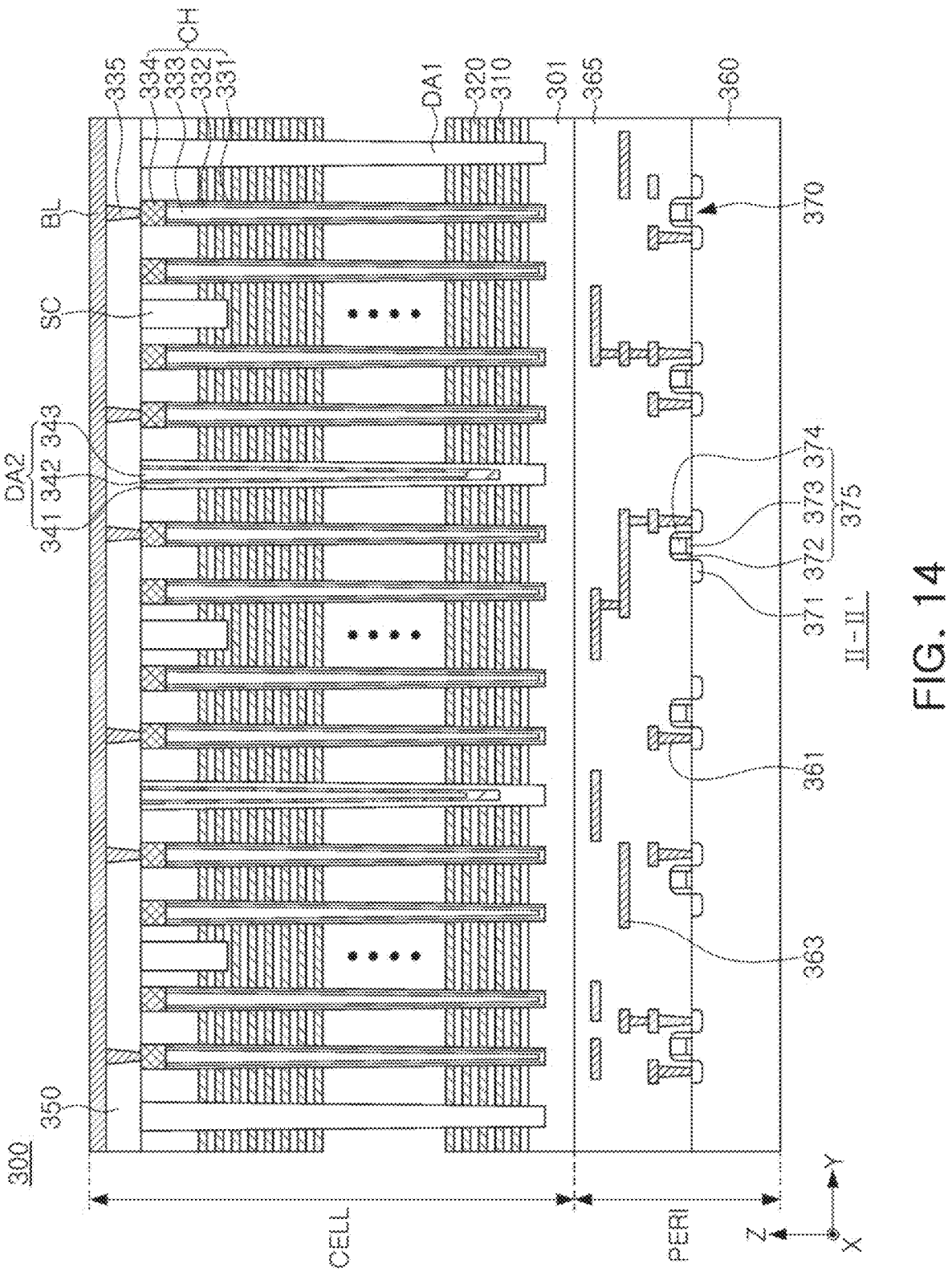
FIG. 14 is a cross-sectional diagram taken along line II-II' in FIG. 13.
Figure 15:
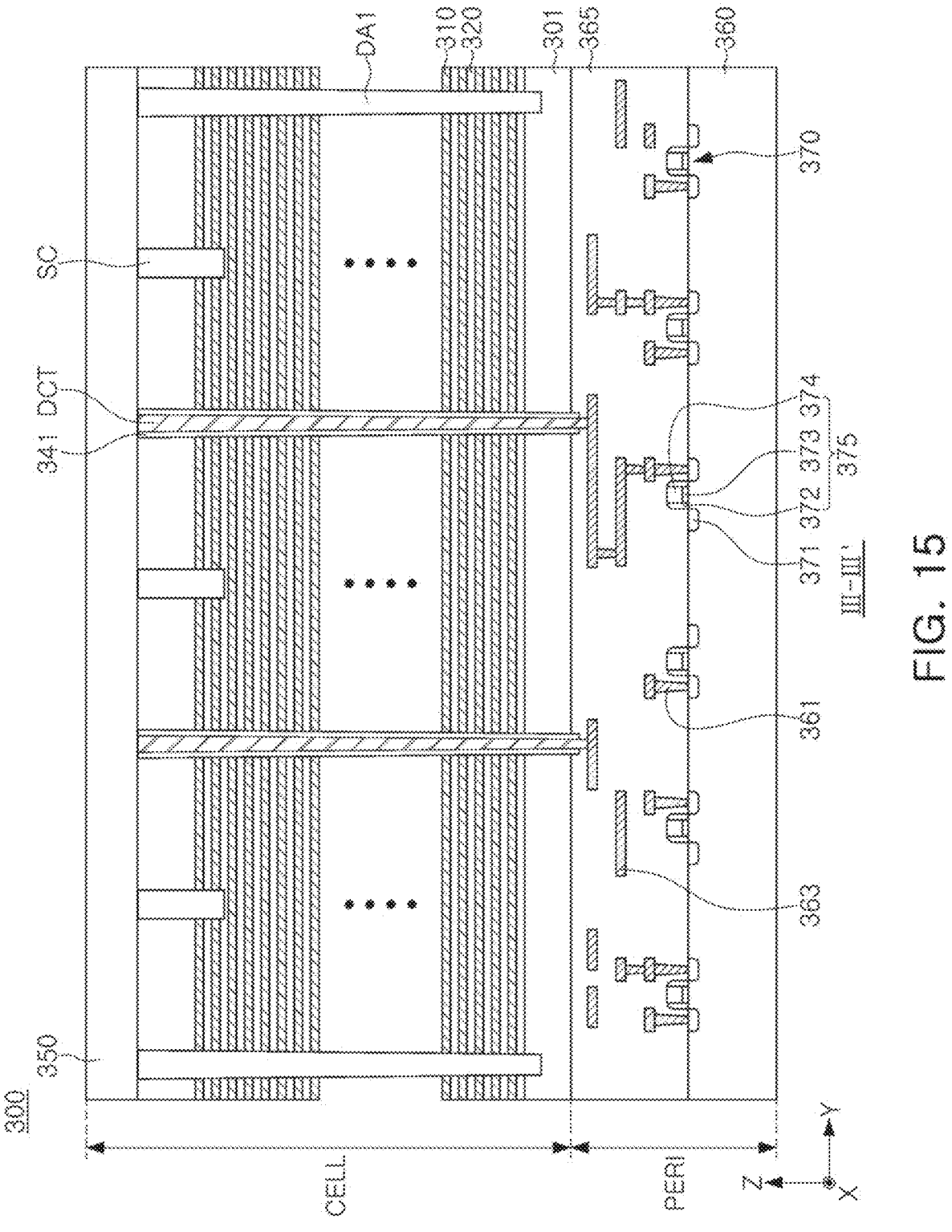
FIGS. 15 and 16 are cross-sectional diagram taken along line III-III' in FIG. 13.
Figure 16:
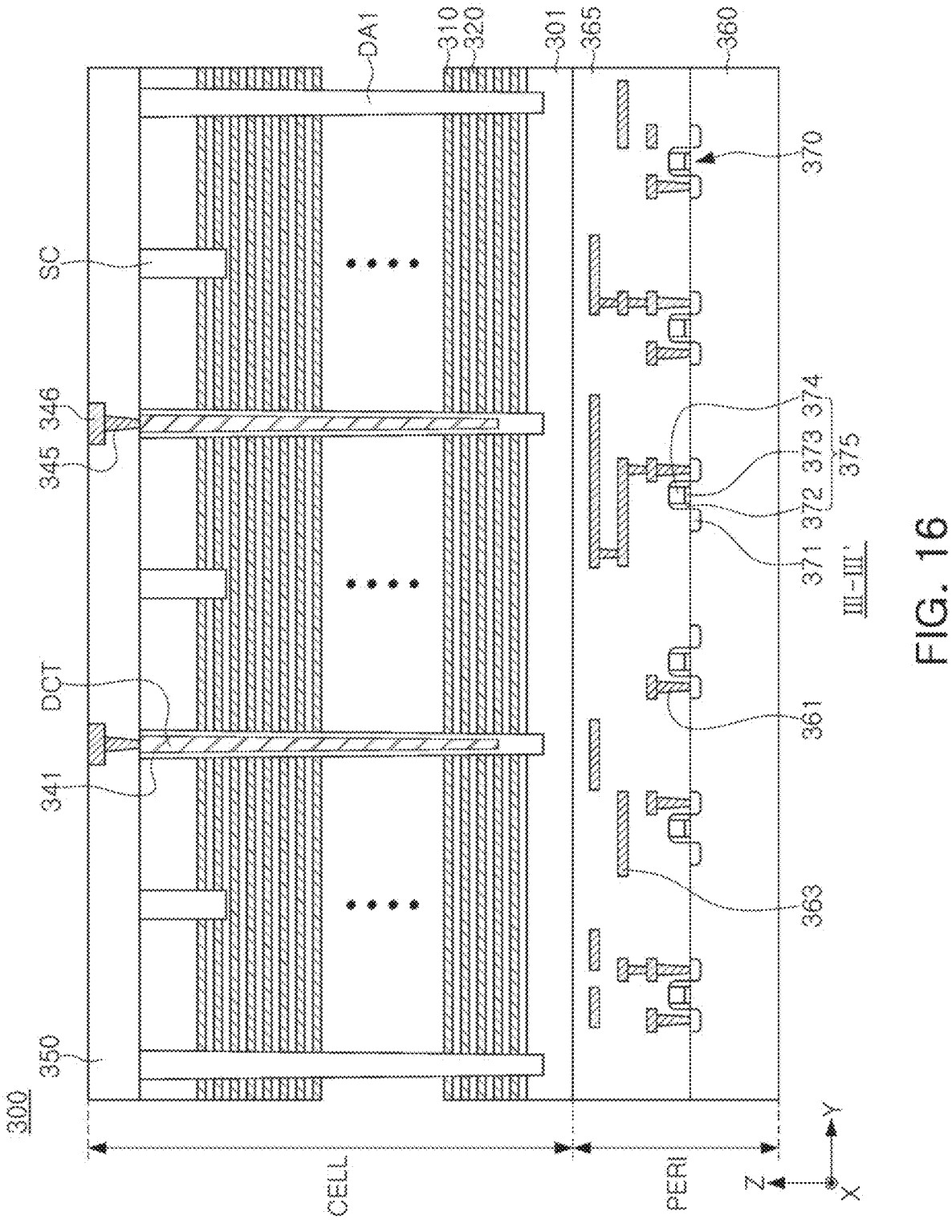

FIG. 13 is a diagram illustrating a structure of a semiconductor device according to an example embodiment. FIG. 14 is a cross-sectional diagram taken along line II-II' in FIG. 13. FIGS. 15 and 16 are cross-sectional diagram taken along line III-III' in FIG. 13.

In the example embodiment in FIGS. 13 to 16, in a semiconductor device 300, the cell region CELL and the peripheral circuit region PERI may be stacked in the first direction (Z-axis) as described above with reference to FIG. 12. Referring first to FIG. 13, the cell region CELL of the semiconductor device 300 may include a cell array region CAR and a cell contact region CTR. For example, the channel structures CH may be disposed in the cell array region CAR, and the cell contacts CMC may be disposed in the cell contact region CTR.

Referring to FIGS. 14 to 16 together, in the cell region CELL, a plurality of gate electrode layers 310 and a plurality of insulating layers 320 alternately stacked in a first direction, and a plurality of channel structures CH extending in the first direction and penetrating the plurality of gate electrode layers 310 may be disposed. A first interlayer insulating layer 350 may be disposed on the plurality of gate electrode layers 310 and the plurality of channel structures CH.

The plurality of channel structures CH may extend to a depth to be recessed into a portion of the first substrate 301 of the cell region CELL. The plurality of gate electrode layers 310 may be formed of a conductive material such as metal or metal silicide, and each of the plurality of channel structures CH may include a gate dielectric layer 331, a channel layer 332, a filling insulating layer 333 and a drain region #34. The drain region 334 of each of the plurality of channel structures CH may be connected to the bit lines BL through the channel contact 335 in the first interlayer insulating layer 350.

The cell region CELL may include a plurality of blocks BLK, and the plurality of blocks BLK may be partitioned by the plurality of first isolation structures DA1 extending in the second direction (X-axis direction) and may be arranged in a third direction (Y-axis direction). Each of the plurality of first isolation structures DA1 may extend in the second direction and may cross the cell region CELL, and may include a first vertical insulating layer formed of an insulating material. For example, each of the plurality of first isolation structures DA1 may be formed of silicon oxide, silicon nitride, or the like.

A plurality of second isolation structures DA2 and an upper isolation layer SC may be disposed in each of the plurality of blocks BLK. The plurality of second isolation structures DA2 and the upper isolation layer SC may extend in the second direction, similarly to the plurality of first isolation structures DA1. Differently from the plurality of first isolation structures DA1 and the plurality of second isolation structures DA2, the upper isolation layer SC may divide only a portion of the gate electrode layers 310 disposed thereon in the first direction into a plurality of regions.

Each of the plurality of second isolation structures DA2 may include a conductive layer 342 formed of a conductive material, differently from the plurality of first isolation structures DA1. Referring to FIG. 14, each of the plurality of second isolation structures DA2 may include a second vertical insulating layer 341, a conductive layer 342, and a third vertical insulating layer 343. However, in example embodiments, the space in the second vertical insulating layer 341 may be filled only with the conductive layer 342 without the third vertical insulating layer 343.

A plurality of elements 370, a plurality of device contacts 361 connected to the plurality of elements 370, and a plurality of wiring patterns 363 may be formed in the peripheral circuit region PERI. The plurality of elements 370 may be formed on the second substrate 360, and the plurality of elements 370, the plurality of device contacts 361, and the plurality of wiring patterns 363 may be covered by the second interlayer insulating layer 365. The first substrate 301 of the cell region CELL may be disposed on the upper surface of the second interlayer insulating layer 365. Each of the plurality of elements 370 may include a source/drain region 371 and a gate structure 375, and the gate structure 375 may include a gate spacer 372, a gate insulating layer 373, and a gate conductive layer 374.

The conductive layer 342 included in each of the plurality of second isolation structures DA may be connected to the peripheral circuit region PERI through the isolation structure contact DCT. In example embodiments, the conductive layer 342 may be connected to the peripheral circuit region PERI by an isolation structure contact DCT directly penetrating the first substrate 301. Referring to FIG. 15, the isolation structure contact DCT may extend in the first direction together with the second vertical insulating layer 341 and may penetrate the first substrate 301. Since the second vertical insulating layer 341 is disposed between the first substrate 301 and the isolation structure contact DCT, the isolation structure contact DCT may not be electrically connected to the first substrate 301.

The isolation structure contact DCT may be connected to at least one of the plurality of wiring patterns 363 in the second interlayer insulating layer 365 of the peripheral circuit region PERI. For example, the device 370 connected to the isolation structure contact DCT through at least one of the plurality of wiring patterns 363 may be configured to be included in the row decoder in the peripheral circuit region PERI.

In example embodiments, the conductive layer 342 may be connected to the peripheral circuit region PERI through the isolation structure contact DCT, and the upper contact 345 and the upper wiring 346 connected to the isolation structure contact DC. Referring to FIG. 16, the isolation structure contact DCT may not directly penetrate the first substrate 301 and may be connected to the upper contact 345 and the upper wiring 346 in the first direction. The upper wiring 346 may be a wiring extending in at least one of the second direction and the third direction, and may be connected to a through wiring penetrating the first substrate 301 and extending to the peripheral circuit region PERI. For example, the through wiring may be formed as a through silicon via.

Figure 17:
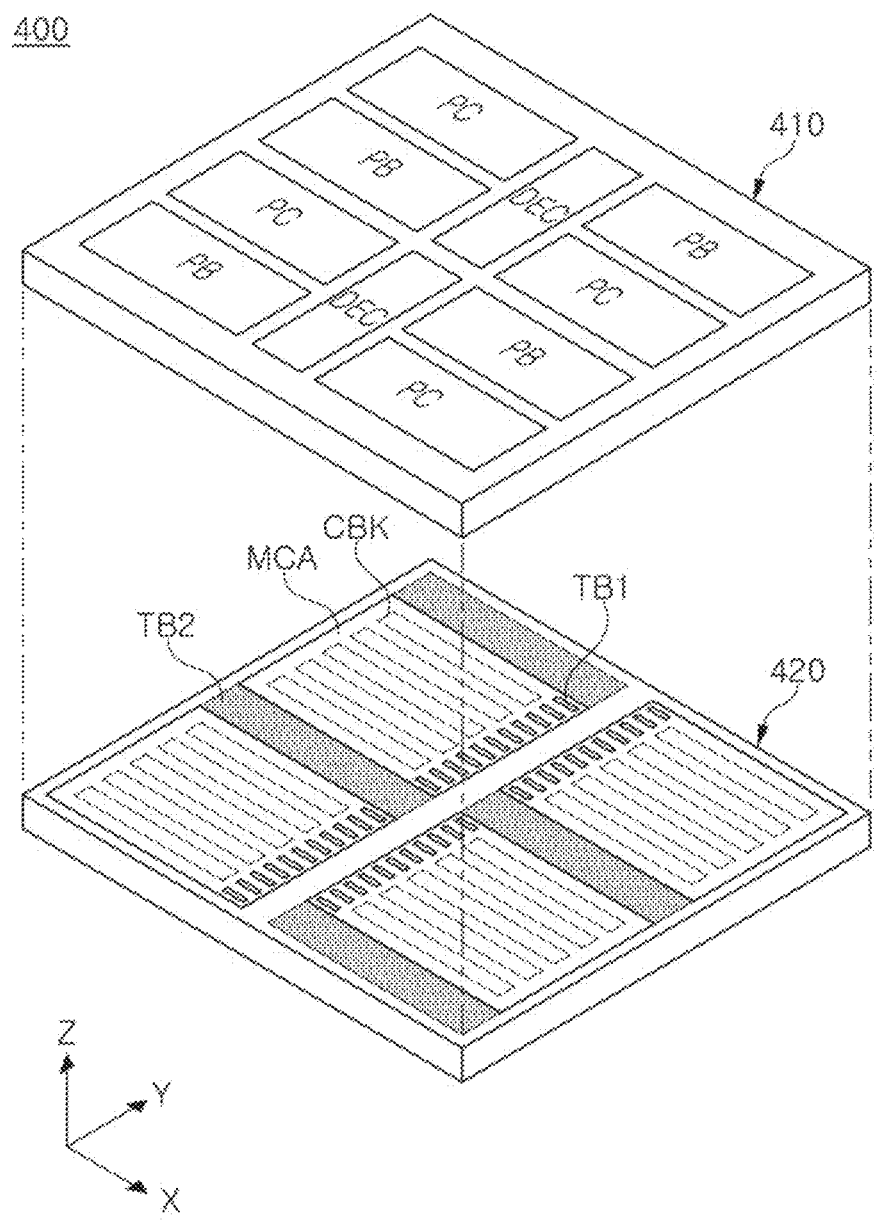
FIG. 17 is a diagram illustrating a structure of a semiconductor device according to an example embodiment of the present disclosure.
Figure 18:
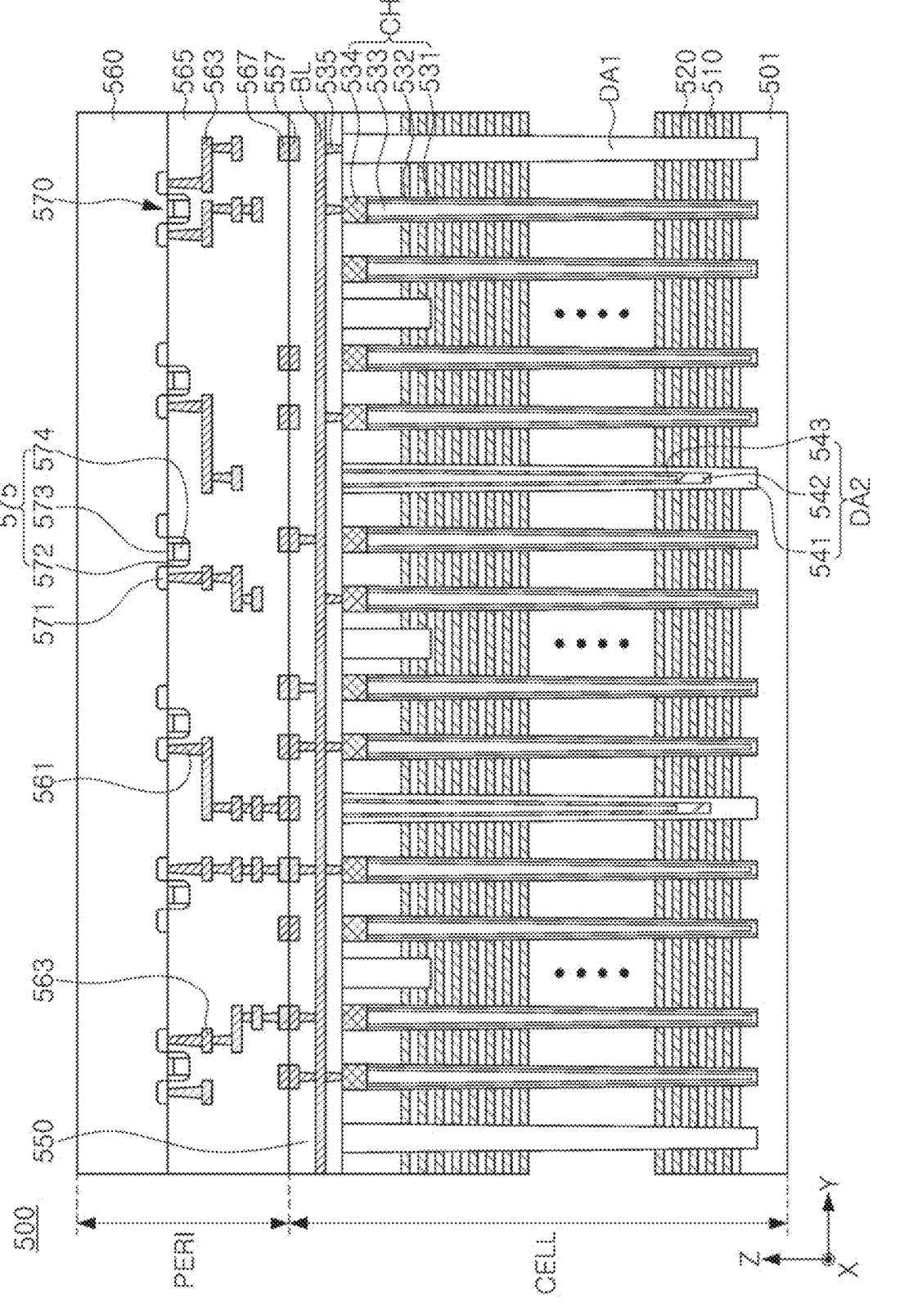
FIGS. 18 and 19 are diagrams illustrating a structure of a semiconductor device according to an example embodiment of the present disclosure.
Figure 19:
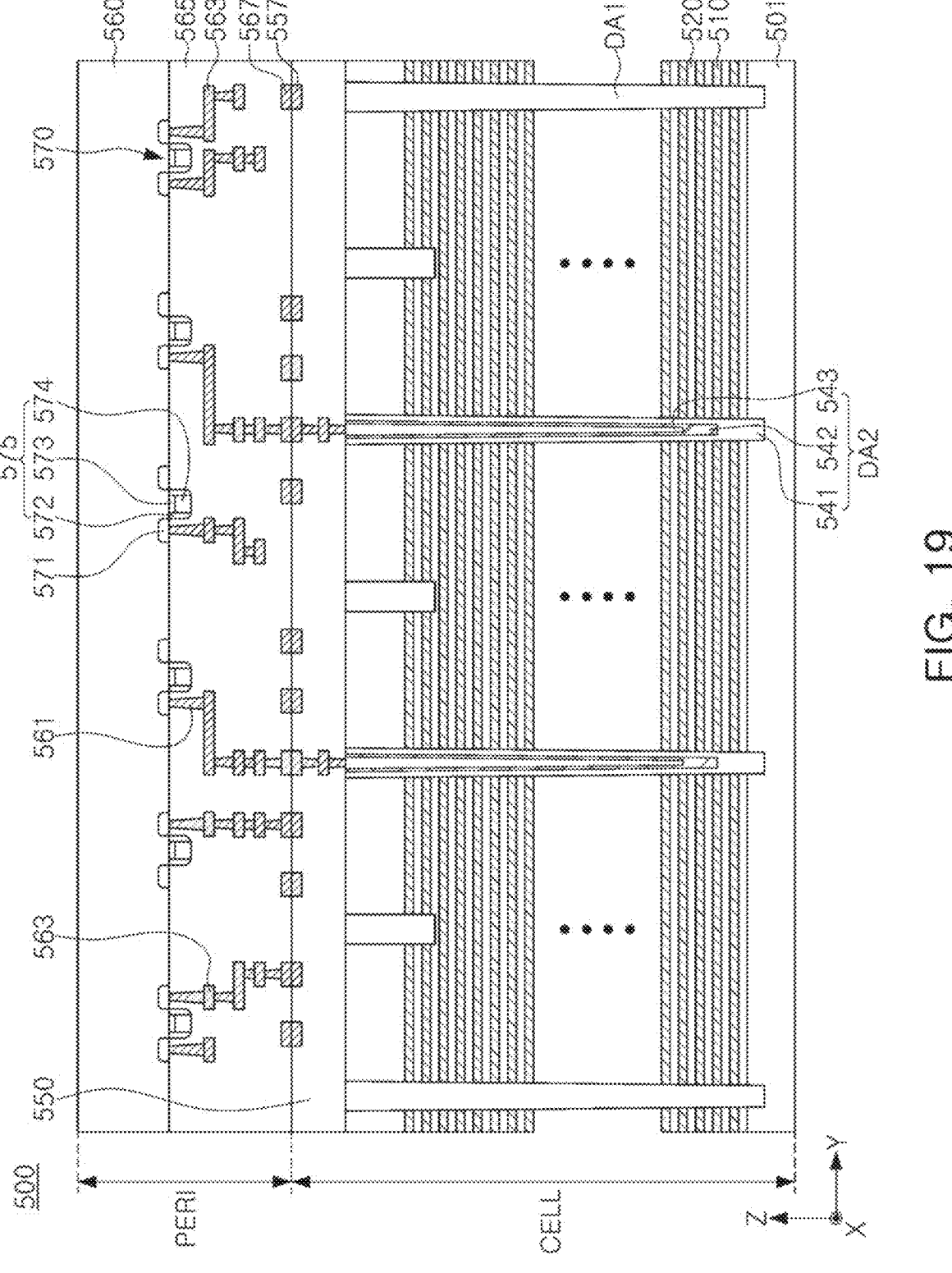

FIG. 17 is a diagram illustrating a structure of a semiconductor device according to an example embodiment. FIGS. 18 and 19 are diagrams illustrating a structure of a semiconductor device according to an example embodiment.

Referring to FIG. 17, a semiconductor device 400 may include a first region 410 and a second region 420 stacked in a first direction (Z-axis direction). The first region 410 may be configured as a cell region, and the second region 420 may be configured as a peripheral circuit region. The configuration of each of the first region 410 and the second region 420 may be similar to the aforementioned example embodiment described with reference to FIG. 12.

However, differently from the example embodiment described with reference to FIG. 12 above, in the example embodiment illustrated in FIG. 17, the second region 420 including the peripheral circuit region may be disposed upside down and may be coupled to the first region 410. Accordingly, elements included in the first region 410 and providing the row decoder DEC, the page buffer PB, and the peripheral circuit PC, the gate electrode layers included in the second region 420, and the channel structures, and bit lines may be disposed between the first substrate of the first region 410 and the second substrate of the second region 420 in the first direction.

Referring to FIGS. 18 and 19, the semiconductor device 500 may include a cell region CELL and a peripheral circuit region PERI stacked in a first direction (Z-axis direction). As described in the aforementioned example embodiment with reference to FIG. 17, the peripheral circuit region PERI may be disposed upside down and may be stacked with the cell region CELL. Accordingly, the elements 570 in the peripheral circuit region PERI, the gate electrode layers 510 in the cell region CELL, and the channel structures CH may be disposed between the first substrate 501 of the cell region CELL and the second substrate 560 of the peripheral circuit region PERI.

For example, the semiconductor device 500 may have a chip to chip (C2C) structure. The C2C structure may formed by manufacturing a first chip including a cell region CELL on a first wafer, manufacturing a second chip including a peripheral circuit region PERI on a second wafer different from the first wafer, and connecting the first chip and the second chip to each other by a bonding method. For example, the bonding method may refer to a method of physically and electrically connecting the bonding pad formed on an uppermost wiring pattern layer of the first chip to the bonding pad formed on an uppermost wiring pattern layer of the second chip. For example, when the bonding pad is formed of copper (Cu), the bonding method may be a Cu—Cu bonding method, and the bonding pad may be formed of aluminum or tungsten.

The cell region CELL may include a plurality of gate electrode layers 510 and a plurality of insulating layers 520 alternately stacked in a first direction perpendicular to the upper surface of the first substrate 501, and a plurality of channel structures CH penetrating through the plurality of gate electrode layers 510 and the plurality of insulating layers 520. Each of the plurality of channel structures CH may include a gate dielectric layer 531, a channel layer 532, a filling insulating layer 533, and a drain region 534, and the drain region 534 may be connected to the bit lines BL through a channel contact 535. The bit lines BL may be electrically connected to at least one of the elements 570 in the peripheral circuit region PERI through a first bonding pad 557 formed on the first interlayer insulating layer 550, and for example, the device 570 connected to the bit lines BL may be one of elements providing a page buffer.

The peripheral circuit region PERI may include a plurality of elements 570 formed on the second substrate 560 and a plurality of wiring patterns 563 connected to the plurality of elements 570. The plurality of wiring patterns 563 may be connected to the plurality of elements 570 through the device contact 561, and the plurality of elements 570 and the plurality of wiring patterns 563 may be disposed in the second interlayer insulating layer 565. The plurality of wiring patterns 563 may be physically and electrically connected to the first bonding pad 557 in the cell region CELL through the second bonding pad 567 formed on the second interlayer insulating layer 565.

To efficiently connect the peripheral circuit region PERI to the cell region CELL, the arrangement of circuits included in the peripheral circuit region PERI may be determined depending on the structure of the cell region CELL. For example, elements providing a page buffer among the plurality of elements 570 may be disposed on the plurality of channel structures CH. Also, elements providing a row decoder among the plurality of elements 570 in the peripheral circuit region PERI may be disposed in the peripheral circuit region PERI to be disposed on cell contacts connected to the plurality of gate electrode layers 510.

Referring to FIGS. 18 and 19, the conductive layer 542 formed in each of the plurality of second isolation structures DA2 may be connected to the first bonding pad 557 through an isolation structure contact DCT and an upper contact 545 disposed on the isolation structure contact DCT. The first bonding pad 557 connected to the isolation structure contact DCT may be connected to at least one of the plurality of elements 570 through the second bonding pad 567 of the peripheral circuit region PERI.

The conductive layer 542 of each of the plurality of second isolation structures DA2 may be connected to a circuit applying a voltage sufficient to generate heat in the conductive layer 542. For example, the conductive layer 542 may be connected to a heating circuit provided by high voltage elements included in a row decoder of the peripheral circuit region PERI. The semiconductor device 500 may apply a voltage to generate heat in the conductive layer 542 by controlling the row decoder. For example, a voltage may be applied to the conductive layer 542 when the number of times of use of a specific block is accumulated by more than the reference number of times or when a program operation is executed, and accordingly, heat may be generated.

Figure 20:
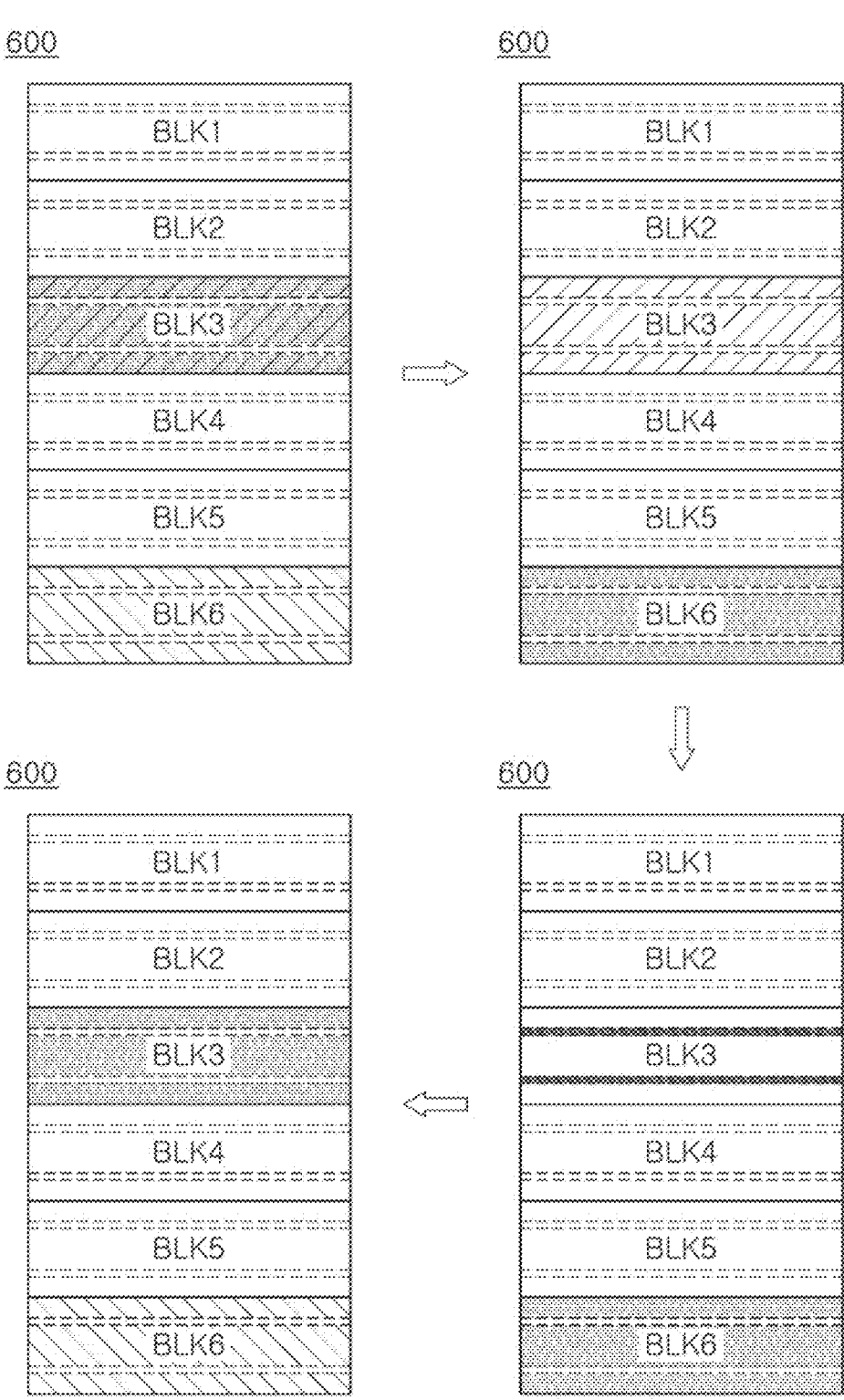
FIGS. 20 and 21 are diagrams illustrating operations of a semiconductor device according to an example embodiment of the present disclosure.
Figure 21:
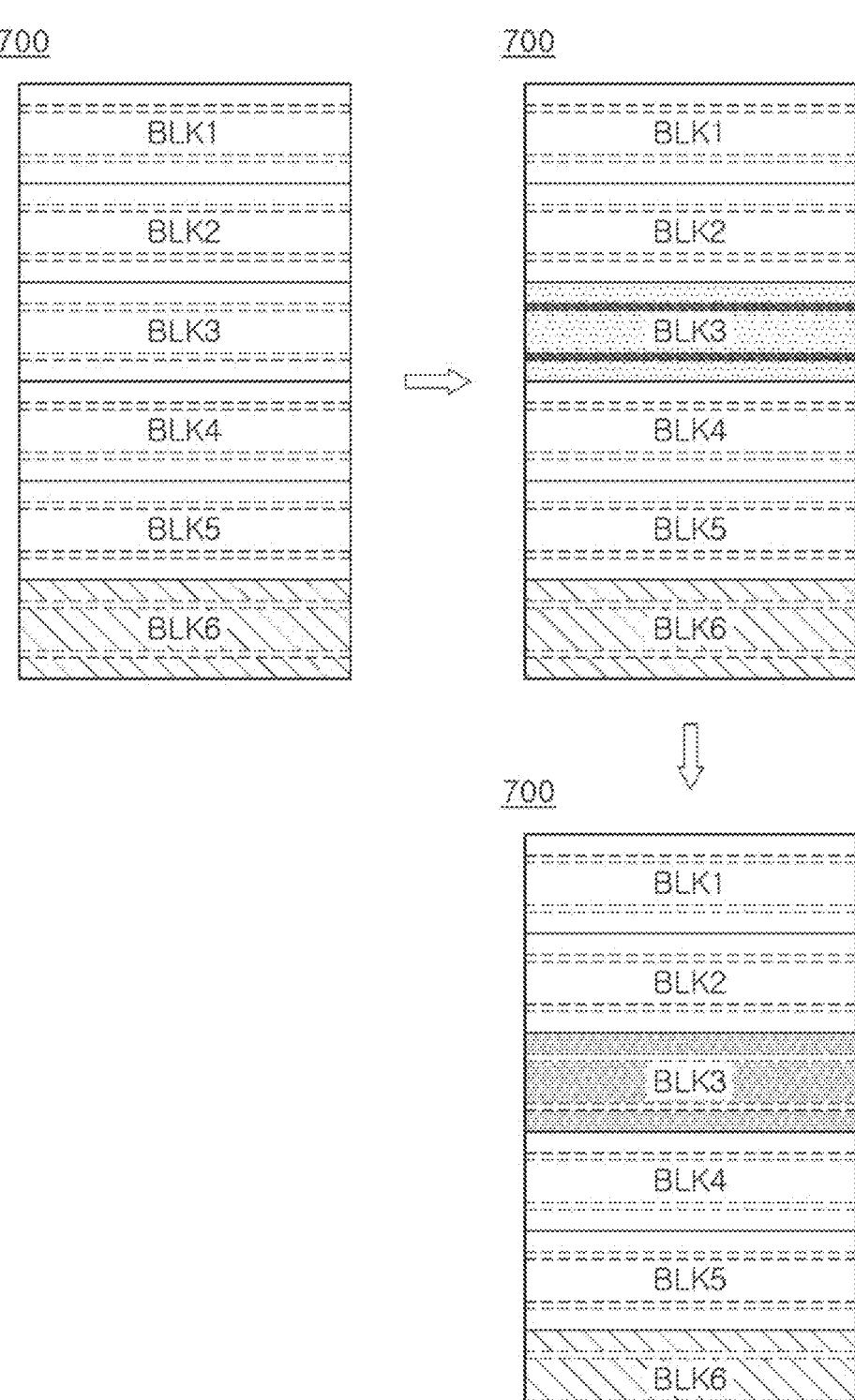

FIGS. 20 and 21 are diagrams illustrating operations of a semiconductor device according to an example embodiment.

Referring first to FIG. 20, a semiconductor device 600 may include a plurality of blocks BLK1-BLK6. The number of the plurality of blocks BLK1-BLK6 may be varied in example embodiments, and in the example embodiment illustrated in FIG. 20, the sixth block BLK may be provided as a spare block. Second isolation structures 610 extending in one direction (horizontal direction) may be disposed in each of the plurality of blocks BLK1-BLK6, and the second isolation structures 610 may include both an insulating layer and a conductive layer.

In the example embodiment illustrated in FIG. 20, the semiconductor device 600 may count the number of times the program operation and the erase operation are executed for each of the plurality of blocks BLK1-BLK6, and may determine whether the number of times of use reaches a desired and/or alternatively predetermined number of times. For example, when a program operation is performed on the third block BLK3 and the number of times of uses for the third block BLK3 reaches or exceeds the reference number of times, the semiconductor device 600 may move data in the third block BLK3 to the sixth block BLK6, a spare block, and may store the data in the sixth block BLK6.

Thereafter, the semiconductor device 600 may perform an erase operation to erase entire data in the third block BLK3, and may input a voltage and/or current to the conductive layer of the second isolation structures 610 included in the third block BLK3. Heat may be generated in the conductive layer by the input voltage and/or current, and deterioration of properties of the memory cells of the third block BLK3 due to the accumulation of the number of times of uses may be compensated for by the heat generated in the conductive layer. For example, by repeating the program operation and the erase operation, the residual electric charges unnecessarily trapped in the charge storage layer of the memory cells of the third block BLK3 may be removed by heat generated from the conductive layer.

The time for which a voltage and/or current is input to the conductive layer may be desired and/or alternatively predetermined. When a curing operation for compensating for deterioration of the third block BLK3 by inputting a voltage and/or current for a desired and/or alternatively predetermined period of time is completed, the semiconductor device 600 may move the data stored in the sixth block BLK3 to the third block BLK3 and may store the data therein.

Thereafter, referring to FIG. 21, the semiconductor device 700 may include a plurality of blocks BLK1-BLK6. The number of the plurality of blocks BLK1-BLK6 may be varied in example embodiments. Second isolation structures 710 extending in one direction (horizontal direction) may be disposed in each of the plurality of blocks BLK1-BLK6, and both an insulating layer and a conductive layer may be included in the second isolation structures 710.

In the example embodiment illustrated in FIG. 21, the semiconductor device 700 may generate heat in the conductive layer by applying a voltage and/or current to the isolation structures 710 while a program operation for the selected memory cells of the target block from among the plurality of blocks BLK1-BLK6 is performed. Referring to FIG. 21, when a program operation is started, heat may be generated by applying a voltage and/or current to the conductive layer of the second isolation structures 710 disposed in the third block BLK3 which is the target block.

When a program voltage is input to a selected word line connected to the selected memory cells while the temperature is increased by generating heat, the threshold voltage of the selected memory cells may change more significantly than when the program operation is executed at a low temperature. Accordingly, after the program operation is completed, performance of the semiconductor device 700 may improve by increasing a voltage margin of the selected memory cells. Alternatively, by completing the program operation with a smaller program voltage, power consumption of the semiconductor device 700 may be reduced.

Figure 22A:
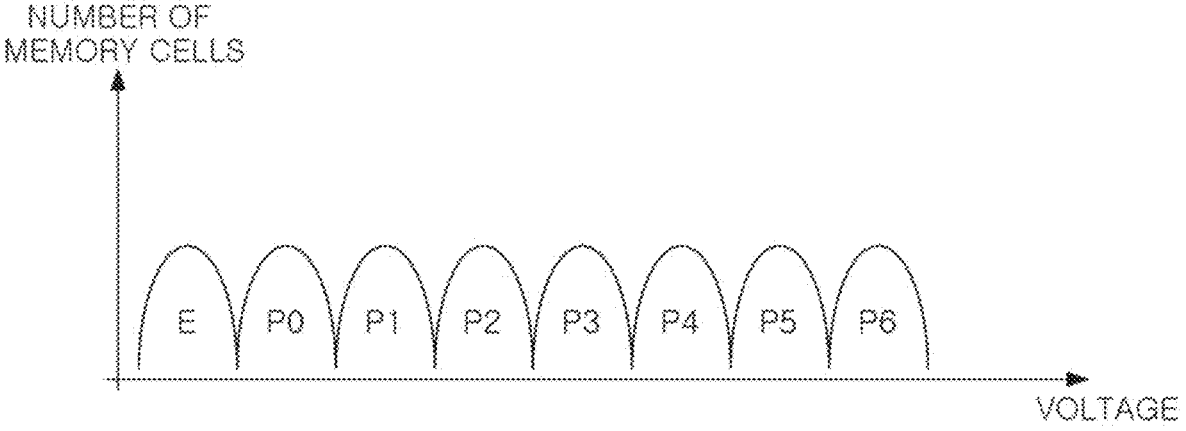
FIGS. 22A and 22B are diagrams illustrating operations of a semiconductor device according to an example embodiment of the present disclosure.
Figure 22B:
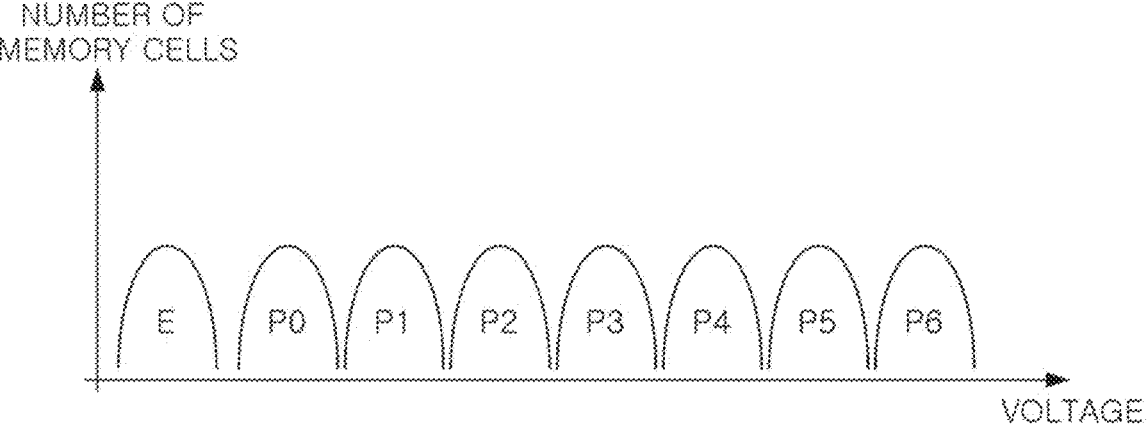

FIGS. 22A and 22B are diagrams illustrating operations of a semiconductor device according to an example embodiment.

Referring to FIGS. 22A and 22B, in the semiconductor device according to an example embodiment, each of the memory cells may store 3-bit data. However, example embodiments are not limited thereto, and each of the memory cells may store 2-bit data or 4-bit or more data. Each of the memory cells may have an erase state E0 and one of first to seventh program states P0-P6. The erase state E0 and the first to seventh program states P0-P6 may match the 3-bit data of "000" to "111", and the page buffer of the semiconductor device may detect the threshold voltage of each of the memory cells and may read data programmed into each of the memory cells.

FIG. 22A may be a diagram illustrating distribution of threshold voltage of memory cells when a program operation is performed without heat generation in a second isolation structure disposed in a block in the semiconductor device. FIG. 22B may be a diagram illustrating distribution of threshold voltage of memory cells when a program operation is executed while generating heat by applying a voltage and/or current to the conductive layer of the second isolation structure disposed in the block.

As illustrated in FIGS. 22A and 22B, by performing a program operation while generating heat in the conductive layer of the second isolation structure, a difference in distribution of threshold voltage matching data written in the memory cells may increase. In other words, a voltage margin between threshold voltages of the memory cells in the erase state E0 and each of the first to seventh program states P0-P6 may increase. Accordingly, possibility of an error occurring in a read operation of the semiconductor device may be reduced, and accordingly, performance of the semiconductor device may improve.

As described above, by performing the program operation while generating heat in the conductive layer of the second isolation structure, the voltage margin between threshold voltages of the memory cells may increase without increasing the program voltage. Accordingly, the program voltage may be reduced under the condition in which heat is generated in the conductive layer of the second isolation structure, and in this case, power consumption of the semiconductor device may be reduced.

Figure 23:
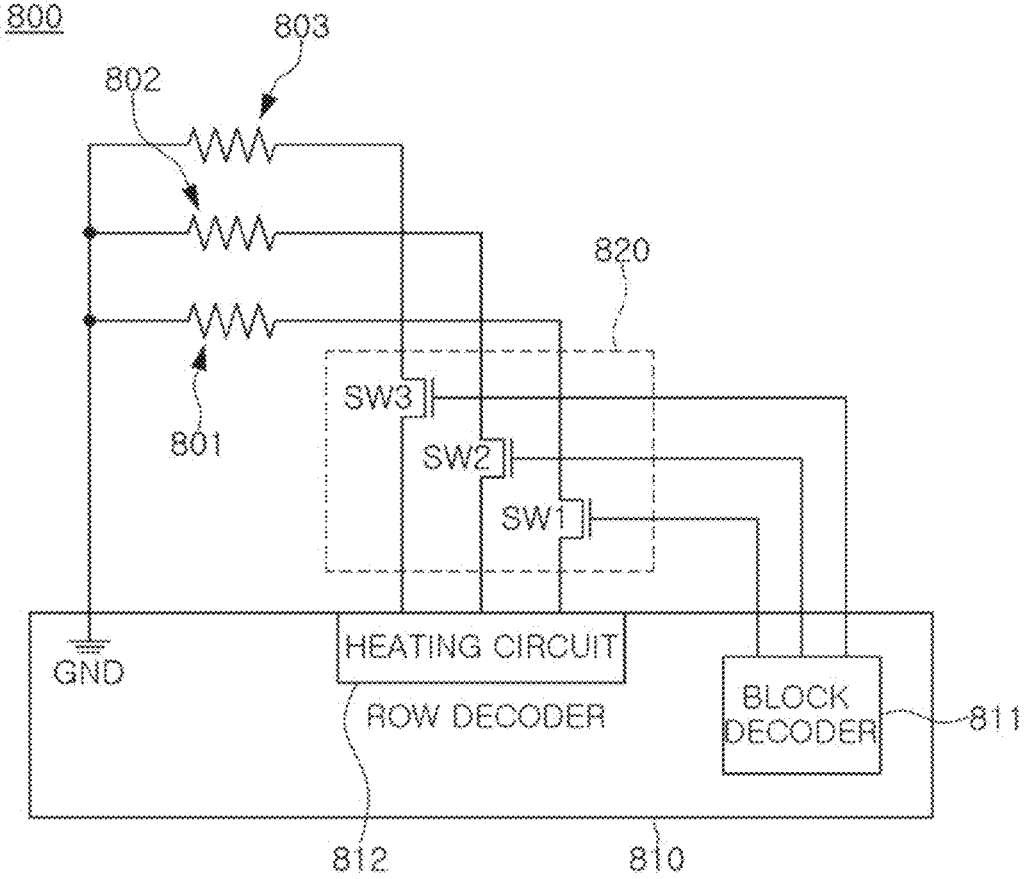
FIG. 23 is a diagram illustrating operations of a semiconductor device according to an example embodiment of the present disclosure.

FIG. 23 is a diagram illustrating operations of a semiconductor device according to an example embodiment.

FIG. 23 may be a circuit diagram illustrating a portion of the components included in the semiconductor device 800 according to an example embodiment. Referring to FIG. 23, a semiconductor device 800 according to an example embodiment may include first to third resistors 801-803, a row decoder 810, and a select circuit 820 including a plurality of heating select elements SW1-SW3. For example, the semiconductor device 800 may include a cell region and a peripheral circuit region, and the cell region may include a plurality of blocks isolated from each other by a plurality of first isolation structures.

The first to third resistors 801-803 may correspond to a conductive layer in the second isolation structures disposed in each of the plurality of blocks. For example, the first resistor 801 may correspond to the conductive layer in the second isolation structure disposed in the first block, the second resistor 802 may correspond to the conductive layer in the second isolation structure disposed in the second block, and the third resistor 803 may correspond to the conductive layer in the second isolation structure disposed in the third block.

The row decoder 810 may be configured as a circuit connected to word lines, ground select lines, and string select lines of the semiconductor device 800, and may include a block decoder 811 for selecting at least one of a plurality of blocks. The heating circuit 812 of the row decoder 810 may control heat generation of each of the first to third resistors 801-803 by inputting a voltage and/or current to the first to third resistors 801-803 through the plurality of heating select elements SW1-SW3.

When the block decoder 811 determines a selected block from among the plurality of blocks, the heating select device connected to the second isolation structure in the selected block among the plurality of heating select elements SW1-SW3 may be turned on. For example, when the first block is selected, the block decoder 811 may turn on the first heating select device SW1 connected to the first resistor 801 corresponding to the second isolation structure in the first block.

The heating circuit 812 may supply a voltage and/or a current to the first resistor 801 through the first heating select device SW1, and heat may be generated in the first resistor 801. For example, when the number of times of use of the first block exceeds a desired and/or alternatively predetermined reference number of times or when a program operation is performed on at least a portion of the memory cells of the first block, the first block may be selected and a voltage and/or current may be input to the first resistor 801. A first time period for which the heating circuit 812 inputs a voltage and/or a current to the first resistor 801 under the condition in which the number of times of use of the first block exceeds the reference number of times may be longer than the second time period for which the heating circuit 812 inputs a voltage and/or a current to the first resistor 801 during the program operation on at least a portion of the memory cells of the first block.

In an example embodiment illustrated in FIG. 23, the heating circuit 812 may include high voltage elements such that a sufficient voltage and/or current may be supplied to generate heat in the first to third resistors 801-803. The block decoder 811 may include low-voltage elements operating with a power supply voltage lower than that of the elements of the heating circuit 812. However, the configuration of elements included in the block decoder 811 and the heating circuit 812 may be varied in example embodiments.

According to the aforementioned example embodiments, when the number of times of use of a specific block among the plurality of blocks is accumulated and exceeds the reference number of times, applying a current and/or voltage to the conductive layer included in the isolation structure in the block, heat may be generated. Unnecessary electric charges in the channel region of the memory cells may be removed by heat generated from the conductive layer, and deterioration of the memory cells due to an increase in the number of times of uses may be compensated for. Also, by generating heat in the conductive layer before the program operation, the voltage margin of the memory cells may increase after the program operation is completed, thereby improving reliability of the semiconductor device.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
a plurality of gate electrode layers stacked in a first direction perpendicular to an upper surface of a substrate;
a plurality of channel structures penetrating through the plurality of gate electrode layers and extending in the first direction;
a plurality of first isolation structures extending in a second direction and dividing the plurality of gate electrode layers into a plurality of blocks, the second direction being parallel to the upper surface of the substrate; and
a plurality of second isolation structures extending in the second direction within each of the plurality of blocks, wherein
each of the plurality of first isolation structures includes a first vertical insulating layer and is free of a conductive layer, and
at least one of the plurality of second isolation structures includes a second vertical insulating layer and the conductive layer.

2. The semiconductor device of claim 1, wherein
the second vertical insulating layer is between at least a portion of the plurality of gate electrode layers and the conductive layer in a third direction, and
the third direction intersects the second direction and is parallel to the upper surface of the substrate.

3. The semiconductor device of claim 1, wherein a length of the second vertical insulating layer in the first direction is longer than a length of the conductive layer in the first direction.

4. The semiconductor device of claim 3, wherein a lower surface of the conductive layer is disposed above an upper surface of a lowermost gate electrode layer among plurality of gate electrode layers in the first direction.

5. The semiconductor device of claim 3,
wherein the plurality of gate electrode layers provide at least one ground select line, a plurality of word lines, and at least one string select line stacked sequentially in the first direction,
wherein a lower surface of the conductive layer is disposed between a lower surface of a lowermost word line among the plurality of word lines and an upper surface of the at least one ground select line, in the first direction.

6. The semiconductor device of claim 1,
wherein the conductive layer includes a first conductive region, a second conductive region, and a third conductive region,
wherein the first conductive region and the second conductive region extend in the second direction and are parallel to each other, and the third conductive region connects the first conductive region to the second conductive region, and
wherein the at least one of the plurality of second isolation structures further includes a third vertical insulating layer disposed between the first conductive region and the second conductive region.

7. The semiconductor device of claim 6, wherein a length of each of the first conductive region and the second conductive region in the first direction is longer than a length of the third conductive region in the first direction.

8. The semiconductor device of claim 1,
wherein the second vertical insulating layer includes a first insulating region in contact with the conductive layer in a third direction intersecting the second direction and parallel to the upper surface of the substrate, and a second insulating region in contact with the conductive layer in the first direction, and
wherein a width of the first insulating region in the third direction is smaller than a thickness of the second insulating region in the first direction.

9. The semiconductor device of claim 1, wherein the first vertical insulating layer and the second vertical insulating layer include a same insulating material.

10. The semiconductor device of claim 1, wherein the first vertical insulating layer includes an air gap in at least one of the plurality of first isolation structures.

11. The semiconductor device of claim 1, wherein a length of the first vertical insulating layer is longer than a length of the conductive layer in the second direction.

12. A semiconductor device, comprising:
a cell region including a plurality of gate electrode layers stacked in a first direction perpendicular to an upper surface of a substrate and a plurality of first isolation structures extending in a second direction parallel to the upper surface of the substrate and dividing the plurality of gate electrode layers into a plurality of blocks; and
a peripheral circuit region including a row decoder connected to the plurality of gate electrode layers,
wherein each of the plurality of blocks includes at least one second isolation structure extending in the second direction and having a conductive layer connected to the row decoder, and
wherein the row decoder is configured to generate heat in the conductive layer by applying a current to the at least one second isolation structure included in a selected block among the plurality of blocks.

13. The semiconductor device of claim 12, wherein the row decoder includes:
heating select elements connected to the at least one second isolation structure in each of the plurality of blocks;
a block decoder configured to control the heating select elements to turn on and off; and
a heating circuit connected to the heating select elements.

14. The semiconductor device of claim 13, wherein
the heating circuit and the heating select elements are in a high voltage region of the peripheral circuit region,
the high voltage region is configured to be supplied with a first power supply voltage, and
the block decoder is in a low voltage region of the peripheral circuit region, the low voltage region is configured to be supplied with a second power supply voltage, and the second power supply voltage is smaller than the first power supply voltage.

15. The semiconductor device of claim 12, wherein the row decoder is configured to generate heat in the conductive layer by applying a voltage to the at least one second isolation structure included in the selected block when a program operation starts on the selected block.

16. The semiconductor device of claim 15, wherein the row decoder is configured to apply a voltage to the at least one second isolation structure for a first time period if a number of times of use for the selected block exceeds a reference number of times of use, the row decoder is configured to apply the voltage to the at least one second isolation structure for a second time period during the program operation, and the first time period and the second time period are different from each other.

17. The semiconductor device of claim 16, wherein the second time period is shorter than the first time period.

18. The semiconductor device of claim 12, wherein the substrate included in the cell region is a first substrate, the peripheral circuit region includes a second substrate different from the first substrate, and the cell region and the peripheral circuit region are stacked in the first direction.

19. The semiconductor device of claim 18, wherein the plurality of gate electrode layers are between the first substrate and the second substrate in the first direction.

20. A semiconductor device, comprising:

a substrate;

a plurality of gate electrode layers stacked in a first direction perpendicular to an upper surface of the substrate;

a plurality of channel structures extending in the first direction through the plurality of gate electrode layers, and each of the plurality of channel structures including a channel layer connected to the substrate; and a plurality of isolation structures extending in a second direction parallel to the upper surface of the substrate and arranged in a third direction intersecting the second direction, wherein a pair of isolation structures most adjacent to each other in the third direction, among the plurality of isolation structures, includes a first isolation structure and a second isolation structure, the first isolation structure includes only a first insulating layer and is free of a conductive layer, and the second isolation structure includes both a second insulating layer and the conductive layer, and a length of the first isolation structure in the second direction is greater than a length of the second isolation structure in the second direction.

* * * * *